(12) United States Patent　(10) Patent No.: US 6,653,052 B2
Tanaka et al.　(45) Date of Patent: Nov. 25, 2003

(54) ELECTRON DEVICE MANUFACTURING METHOD, A PATTERN FORMING METHOD, AND A PHOTOMASK USED FOR THOSE METHODS

(75) Inventors: Toshihiko Tanaka, Tokyo (JP); Norio Hasegawa, Nishitama (JP); Hiroshi Shiraishi, Hachioji (JP); Hidetoshi Satoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/810,194

(22) Filed: Mar. 19, 2001

(65) Prior Publication Data

US 2001/0033995 A1　Oct. 25, 2001

(30) Foreign Application Priority Data

Apr. 25, 2000　(JP) ........................................ 2000-128944

(51) Int. Cl.$^7$ .............................. G03F 7/50; G03F 9/00
(52) U.S. Cl. ............................. 430/311; 430/22; 430/30
(58) Field of Search ................................. 430/322, 324, 430/394, 396, 5, 311, 22, 30

(56) References Cited

U.S. PATENT DOCUMENTS

| 5,348,826 A | * | 9/1994 | Dao et al. | 430/322 |
| 5,472,814 A | * | 12/1995 | Lin | 430/323 |
| 5,620,815 A | * | 4/1997 | Ito et al. | 430/321 |
| 5,631,109 A | * | 5/1997 | Ito | 430/323 |

FOREIGN PATENT DOCUMENTS

| JP | 58-173744 | 10/1983 | |
| JP | 05-289307 | * 5/1993 | ............. G03F/1/08 |
| JP | 5-289307 | 11/1993 | |
| JP | 9-211837 | 8/1997 | |

* cited by examiner

Primary Examiner—Mark F. Huff
Assistant Examiner—Kripa Sagar
(74) Attorney, Agent, or Firm—Mattingly, Stanger & Malur, P.C.

(57) ABSTRACT

A method of manufacturing an electron device provided with minute structure such as a semiconductor integrated circuit using projection exposure technique and phase shift mask technique, maintaining a high yield is disclosed. In an electron device manufacturing method according to the invention, a desired electron device is manufactured by printing a light shielding film pattern on a photosensitive film provided on the surface of a workpiece by a projection tool using a mask where a phase shifter having predetermined thickness is partially formed on the flat surface of a transparent plate and a light shielding film having a predetermined pattern and made of non-metal is partially provided with the film covering the end of the shifter and developing the photosensitive film. Further, concretely, the above pattern is printed using a mask where the light shielding film made of non-metal is partially extended on the surface of the shifter and the transparent plate including the end of the shifter by the projection tool. According to the electron device manufacturing method according to the invention, an electron device provided with minute structure can be precisely manufactured maintaining a high yield.

14 Claims, 27 Drawing Sheets

(a)

(b)

(f)

(g)

(h)

(i)

(j)

(f)

(g)

(a)

(b)

(c)

(d)

(e)

F I G. 1 1 B
(f) 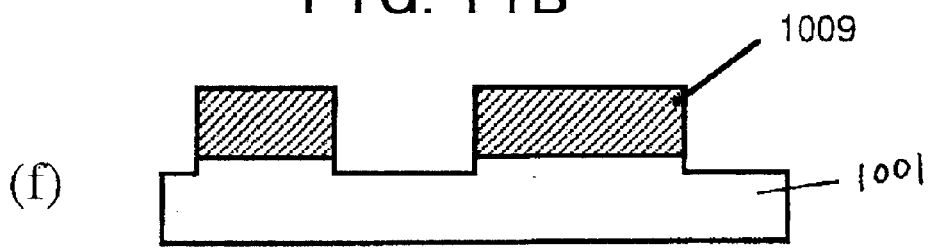
(g) 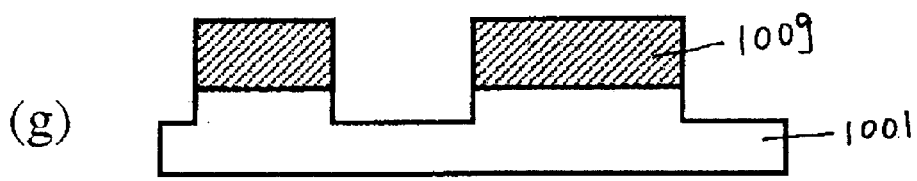
(h) 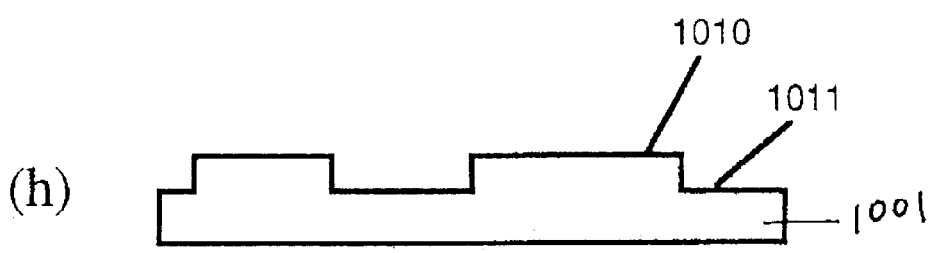
(i) 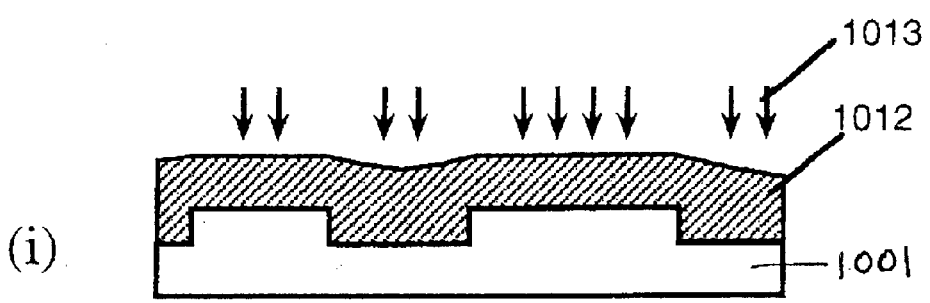
(j) 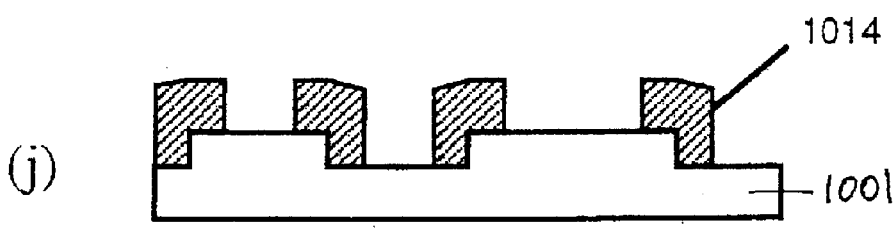

(a)

(b)

(a)

(b)

1604  1602  1603  1601

(a)

(b)

(a)

(b)

(c)

(a)

(b)

ELECTRON DEVICE MANUFACTURING METHOD, A PATTERN FORMING METHOD, AND A PHOTOMASK USED FOR THOSE METHODS

BACKGROUND OF THE INVENTION

1. Field of the Invention

The present invention relates to a method of manufacturing an electron device such as a semiconductor device, a superconductive device, a micro machine and an electronic device, a pattern forming method used for the method, a photomask used for these methods and its manufacturing method, particularly relates to technique effective to apply to exposure technology in a process for manufacturing a semiconductor integrated circuit.

2. Description of the Related Prior Arts

In manufacturing a semiconductor integrated circuit, for a method of printing a minute pattern on a semiconductor wafer, lithography is used. In lithography, a projection tool is mainly used, a pattern of a photomask installed in a projection tool is printed on a semiconductor wafer and a device pattern is formed.

A normal photomask is produced by processing light shielding materials such as chromium (Cr) formed on the flat surface of a transparent quartz substrate. That is, a light shielding film made of chromium or others is formed on the flat surface of a quartz substrate in a desired shape. For the processing of the light shielding film, for example, after an electron beam sensitive resist is applied on the light shielding film, a desired pattern is written on the electron beam sensitive resist by an electron beam writer, next, a resist pattern in a desired shape is formed by development, afterward, dry etching or wet etching is applied using the resist pattern as a mask and the light shielding film is processed. Afterward, after the resist is removed, cleaning and others are performed and a light shielding pattern in a desired shape is formed on the transparent quartz substrate.

Recently, the integration of LSI has been accelerated, the enhancement of the operational speed has been demanded and the miniaturization of a circuit pattern has been demanded. This tendency particularly remarkably appears in a gate pattern that has a large effect upon the operational speed of a transistor. For a part of logic LSI products, a gate pattern of 0.1 $\mu$m is also already formed using a KrF excimer laser (wavelength: 248 nm) for exposure.

For a semiconductor memory, miniaturization is accelerated to reduce the cost and a dynamic random access memory (DRAM) according to a rule that half pitch is 0.18 $\mu$m is manufactured using a KrF excimer laser for exposure. DRAM according to a rule that half pitch is 0.13 $\mu$m using a KrF scanner is also developed.

It is owing to an exposure method called super resolution that by far smaller patterning than the wavelength of exposure is enabled. Super resolution effective to form a minute pattern is called phase shift lithography and is disclosed in Japanese published unexamined patent application No. Sho 58-173744 for example. The phase shift lithography is a method of forming structure called a phase shifter for alternately inverting the phase of exposure light in windows in which a part where exposure light is transmitted of a photomask, that is, a glass face is seen with a light shielding part between the windows and exposing using this photomask. As the phase of light transmitted in both transmitted parts is inverse, the amplitude of light may be zero in the light shielding part between the parts. In case the amplitude is zero, the intensity of light is also zero and the resolution is greatly enhanced.

For an example of the disclosure of another technique related to a mask, Japanese published unexamined patent applications No. Hei 9-211837 and No. Hei 5-289307 can be given.

For a phase shifter, there are a carved type that a part of a glass plate as a photomask is carved, a type that a transparent film having the thickness enough to invert the phase is formed on the base material of a photomask and a type that these two are mixed.

A carved type phase shift mask is produced as follows. As shown in (a) of FIG. 2A, a Cr film 202 made of light shielding material is deposited on the flat surface of mask base material (a quartz substrate) 201 by sputtering and an EB resist 203 is applied to it. A pattern for light shielding is written by EB (shown by an arrow 204). The pattern is developed, a resist pattern 205 is formed ((b) of FIG. 2A), the Cr film 202 is etched by dry etching or wet etching ((c) of FIG. 2A), the resist is removed and a light shielding pattern 206 is formed ((d) of FIG. 2A). Afterward, an EB resist 207 is applied and a pattern for forming a phase shifter is exposed (shown by an arrow 208)((e) of FIG. 2A). Development is performed, a resist pattern 209 is formed ((f) in FIG. 2B) and the quartz substrate is carved by desired depth by dry etching ((g) of FIG. 2B). The resist is peeled, phase difference between both apertures 210 and 211 is inspected ((h) of FIG. 2B), in case carved quantity for making phase difference does not reach a target value, an EB resist 212 is applied again, a shifter pattern is written 213 ((i) in FIG. 2B), development is performed, a shifter pattern 214 is formed ((j) in FIG. 2B), the quartz substrate is etched again by dry etching ((k) in FIG. 2C), the resist is peeled and phase difference is inspected ((1) in FIG. 2C). Afterward, as shown in (m) of FIG. 2C, wet etching is performed, overhang structure 215 having the Cr film as an overhang is formed and a carved type phase shift mask is manufactured.

In the meantime, a transparent film formation type (hereinafter called an additive phase shifter type) phase shift mask is produced as follows. As shown in (a) of FIG. 3A, a Cr film 302 made of light shielding material is deposited on the flat surface of a mask substrate (a quartz substrate) 301 by sputtering and an EB resist 303 is applied on it. A pattern for light shielding is written by EB (304). Development is performed, a resist pattern 305 is formed ((b) of FIG. 3A), the Cr film is etched by dry etching or wet etching ((c) of FIG. 3A), the resist is removed and a light shielding pattern 306 is formed ((d) of FIG. 3A).

Afterward, a spin-on-glass (SOG) film is applied, heating processing and others are performed and a transparent shifter 307 is formed ((e) in FIG. 3A). Afterward, an EB resist 308 is applied and a pattern for forming a phase shifter is exposed (309) ((f) in FIG. 3B). Development is performed, a resist pattern 310 is formed ((g) in FIG. 3B) and a transparent shifter is etched by dry etching or wet etching ((h) in FIG. 3B). The resist is peeled, phase difference between both apertures 311 and 312 is inspected and a phase shift mask is acquired ((i) in FIG. 3B).

For light shielding material in both methods, the metallic Cr film is used and in addition, as the accuracy of the light shielding pattern is required, the metallic Cr film is formed on the flat surface of the quartz substrate by sputtering.

For the type of the phase shift mask, there are a shifter edge type that phase difference is given to the light shielding pattern 401 which can be regarded as an optically isolated pattern as shown in FIG. 4 by optical path difference 402 on both sides of the light shielding material 401 and Levenson type that a phase shifter 502 is alternately arranged on a light shielding pattern 501 closely assembled like a line and space as shown in FIG. 5 in an aperture. Reference numbers 403 and 503 in FIGS. 4 and 5 both denote a glass substrate. In both cases, structure for inverting the phase of exposure light transmitted in the aperture on both sides of the aperture is also provided.

A problem in the printing characteristics of the carved type phase shift mask is that the quantity of transmitted light in an aperture 602 (hereinafter called a phase 0) in which a glass substrate 601 is not carved or is not carved so much as shown in (a) of FIG. 6 and in an aperture 603 (hereinafter called a phase $\pi$) in which the glass substrate is deep carved varies by light scattering on the side 605 of the glass substrate formed under the side wall 604 of Cr light shielding material and the dimension difference of a pattern called $0/\pi$ difference is caused by the variation.

To prevent this, a side etch carved type that the glass side 611 is backed from the edge 612 of Cr light shielding material 613 as shown in (b) of FIG. 6 and light scattered on the glass side is shielded by the Cr light shielding material is proposed.

However, in this case, there is a problem that the width 614 of glass supporting the Cr light shielding material 613 is thinned as the pattern is miniaturized and miniaturization is impossible in view of the strength. Particularly, in a both sides carved type of mask in which the glass substrate 601 is also carved in the phase 0 602 as shown in (c) of FIG. 6, the problem of area in which the Cr film and the glass are touched is a large problem. The Cr light shielding material 613 is required to be supported by a thin glass support 616 and as a pattern becomes complex and minute, the problem becomes more serious.

Further, recently, the magnification of a mask of a lithography equipment progresses from "10×" to "5×" and further, to "4×", hereby, as a dimension on the mask is required to be further acceleratedly reduced by the reduction of a device dimension, the thinness of the support is a definite problem that determines the limit of printing. In manufacture, there is a problem that foreign matters accumulate in a pocket 615 and the yield of masks is hardly enhanced. When the shifter is carved by dry etching, there is a problem that carved depth differs depending upon a pattern dimension by micro loading effect in etching and therefore, a phase angle differs according to the pattern dimension. Further, As shown in FIGS. 2A to 2C, there is a problem that as the number of mask manufacturing processes is many, a mask manufacturing cost is high, time required for manufacture is long, turn around time (TAT) is large and the number of processes is many, the yield is low.

In the meantime, in the additive phase shifter type phase shift mask, as shown in FIG. 5, there is a problem that as the shifter 502 is formed on the Cr light shielding film 501 made of light shielding material, the phase shifter cannot be formed with fixed thickness, the phase angle varies according to a pattern dimension and the phase (that is, the thickness of the shifter) varies between the center 504 of the pattern and the periphery 505 in one pattern.

Furthermore, even if a phase shifter is produced beforehand and the formation on the phase shifter of a Cr light shielding film is tried to solve the problems, it is extremely difficult to form a Cr film free of a defect and having high quality by sputtering on a substrate having difference in a level because of the shifter. Further, there is a problem that as the Cr film made of light shielding material is formed on the shifter, the surface of the Cr film is not flat, the Cr film has inclined or irregular structure, exposure light is largely reflected and a pattern printing characteristic is deteriorated. For example, as shown in FIG. 16, it is proposed that a countermeasure for forming a Cr oxide layer 1404 for preventing reflection on the surface of a Cr film 1403 formed on blanks 1401 made of a quartz transparent substrate and preventing reflection from the surface of the Cr film using a thin film interference phenomenon is taken, however, there is an extremely important problem in accelerating a minute pattern that as a part of the Cr film covers a shifter pattern 1402, the Cr film has an inclined or irregular surface, a diagonal part 1405 is partially formed, as the thickness of the Cr oxide film there cannot be precisely controlled according to a predetermined reflection prevention condition, the reflectivity partially differs as shown by arrows 1406 and 1407 in FIG. 16 and a printing characteristic is deteriorated.

Therefore, it has been more and more difficult to manufacture the electron device provided with the complex and minute patterns using such a mask and a projection tool precisely and with a high yield.

SUMMARY OF THE INVENTION

Therefore, the object of the invention is to provide the improved manufacturing method of an electron device using a phase shift mask. For example, the object is to provide a method of manufacturing an electron device formed by plural minute patterns having the width and an interval of 0.1 $\mu$m or less using a projection tool and phase shift mask technique with a satisfactory yield.

Another object of the invention is to provide a minute pattern forming method suitable for the manufacturing method of such an electron device and a mask improved for the method.

Further another object of the invention is to provide improved technique that can enhance the critical dimension accuracy of lithography equipment in a method of manufacturing an electron device using a phase shift mask.

Further concretely, the object is to provide a minute pattern forming method wherein no dimension accuracy is deteriorated by the effect of reflected light from the surface of light shielding material in projection exposure using a phase shift mask having high phase angle controllability and others and provide a minute electron device using the method.

The outline of the representatives of the inventions disclosed in this application will be briefly described below.

That is, in the invention, a phase shifter having predetermined thickness is partially formed on the flat surface of a transparent plate, a light shielding pattern is printed on a photosensitive film provided on the surface of a workpiece using a mask where a light shielding film that covers the end of the shifter, is made of non-metal and has a predetermined pattern is partially provided by a projection tool and an electron device is manufactured by developing the photosensitive film. Further concretely, the pattern is printed by projection exposure using a mask where the light shielding film made of non-metal is partially extended on the surface of the shifter and the transparent plate including the end of the shifter.

In another invention, a concavity or a convexity having predetermined depth or height is partially formed on the flat surface of a transparent plate, a light shielding pattern is printed on a photosensitive film provided on the surface of a workpiece using a mask wherein a light shielding film that covers the end of the concavity or the convexity, is made of non-metal and has a predetermined pattern is partially provided by a projection tool and an electron device is manufactured by developing the photosensitive film. Further concretely, the pattern is printed by projection exposure using a mask where the light shielding film made of non-metal is partially extended on the surface including the end of the concavity or the convexity of the transparent plate and adjacent to the end of the concavity or the convexity of the transparent plate by projection exposure.

In any invention, as phase shift means is formed on the flat surface of the transparent plate, the phase shift angle of exposure light in the phase shifter in printing can be secured in a predetermined region precisely.

In any invention, for a light shielding film made of non-metal, a light shielding film the reflectivity of exposure light in printing of which is smaller than that on a metallic film such as a Cr film is desirable and it is desirable that for example, a film made of dielectric material, high resistance material or organic material is used. Further concretely, it is also favorable to manufacture the mask itself that the light shielding film itself is a photosensitive film and it is desirable that a photoresist made of novolac resin or phenol resin is used. Or it is desirable that a photosensitive film such as a polyaniline resin film is used.

As the reflectivity of exposure light in printing can be made smaller than that on a metallic film such as a Cr film from relation with the refractive index by using a film made of dielectric material, high resistance material and organic material for a light shielding film, a flare can be reduced even if the light shielding film has the irregular surface and the invention is advantageous to enhance the resolution and the dimension accuracy. As described later, as waveguide effect caused on the side wall due to the thickness of the light shielding film (that is, a mask pattern) itself can be reduced by exposure light in printing, difference in a dimension after processing made by the difference in the thickness of the light shielding film can be reduced even if the light shielding film has the irregular surface and the invention is extremely advantageous to enhance processing accuracy.

As described above, according to the invention, as a phase shift angle in a mask can be precisely controlled, and the resolution and the dimension accuracy in printing can be enhanced, the manufacturing yield of an electron device such as a semiconductor integrated circuit provided with a complex and minute pattern can be enhanced.

(a) in FIG. 1 shows an example of a mask according to the invention. As clear from FIG. 1, the mask has an undernearth phase shifter additive light shielding mask structure in which a light shielding pattern 3 made of dielectric material, high resistance material or organic material is formed at the end of the phase shifter 2 so that the light shielding pattern covers a part having difference in a level formed by the surface of the phase shifter and the surface of the blanks 1 after a transparent phase shifter 2 patterned on the flat surface of blanks 1 such as a transparent quartz plate is formed beforehand. When a mask manufacturing process is considered, a case that the light shielding pattern is written on the upside as shown in FIG. 1 is easily understood, however, when a mask is inserted into lithography equipment in printing, the mask is installed in the lithography equipment in a direction shown in (b) FIG. 1, that is, in a state in which the pattern face of the mask is opposite to the surface of a workpiece 11 to be an electron device of a semiconductor substrate and others on the surface of which a photosensitive photoresist film 12 is provided, projected exposure light 15 is radiated from the top, that is, from the rear surface of transparent blanks and the photosensitive film 12 on the surface of the workpiece 11 is exposed according to a mask pattern formed by the light shielding material 3. The light shielding pattern is printed on the photosensitive film by developing the exposed photosensitive film 12.

Further, if a transparent film (not shown in FIG. 1) the refractive index n' of exposure light having the wavelength of λ in printing of which is larger than the refractive index of the blanks glass and is smaller than the refractive index n of the phase shifter is provided between the phase shifter 2 and the mask substrate (so-called blanks glass) 1 so that the following expression is met (the thickness of the transparent film: d'), dimension accuracy is further enhanced.

$$\sin(2\pi n'(d'+\lambda/2(n-1))/\lambda)=\sin(2\pi n'd'/\lambda)$$

Also, when the section in the direction of the thickness of the end of the phase shifter 2 is an inclined shape (that is, a tapered shape), the dimension accuracy of the light shielding pattern formed on the phase shifter is enhanced and bonding strength is enhanced, however, as occupied area is increased by the quantity, it is desirable that the taped angle is 45 degrees or more. Actually, approximately 60 degrees is desirable.

Furthermore, if the phase shifter 2 is formed using photosensitive SOG, the mask manufacturing process can be greatly reduced, TAT is also enhanced and further, the yield of the mask is also enhanced.

Further, in case the light shielding pattern 3 in the phase shift mask was formed by a photoresist film, these inventors found that there were the following various problems when a photomask was actually used in the manufacturing process of a semiconductor integrated circuit and in the actual manufacture of the phase shift mask and found their solving means.

First, the detection of a pattern depending upon a so-called alignment mask between the shifter and the light shielding material and a pattern measurement mark for relatively positioning a shifter pattern of the phase shift mask and the light shielding pattern is difficult. This comes into question particularly in case the phase shifter is formed beforehand. The shifter has a type in which the glass substrate is carved and a type in which SOG and others are deposited, and the material is the same or the similar as/to the material of the glass substrate. Therefore, difference between an electron beam for writing used in alignment and the reflectivity at the edge of the mark of the shifter is small and the detection of a pattern is difficult. Therefore, in case a shifter pattern is formed beforehand, it is difficult to align the shifter pattern and the light shielding pattern. Its solving means is as follows.

Before the shifter is formed, a metal region made of metal is arranged outside a pattern region to be printed on the surface of the mask substrate, that is, outside an integrated circuit pattern formation region in the manufacture of a semiconductor integrated circuit and an alignment mark to be an alignment criterion when a shift pattern and a light shielding pattern are written is formed on the metal. A first problem is solved by this means.

Second, it is difficult to detect a predetermined pattern used for detecting various information such as a device discrimination mark. For example, in a mask inspection machine, a tungsten halogen lamp and others are mainly used for the alignment of a mask, however, as transmissivity in a resist is high and a high contrast cannot be acquired when a detection mark on a mask is formed by a resist pattern in case the mask is installed in a mask inspection machine, it is difficult to detect a pattern. Therefore, it is difficult to align the mask and the inspection machine and there is a problem that satisfactory inspection is impossible. Not only when a mask is installed in the inspection machine but when a mask is installed in lithography equipment, a mark for identifying the form of a mask is required. At this time, it is desirable to enhance work efficiency that a mark which an operator can read is also provided in addition to a mark read by a machine. At this time, a character directly written on the glass substrate with the shifter and resist light shielding material is very difficult to read and an error in reading occurs. Its solving means is as follows.

A metal region made of metal is arranged on the mask substrate outside a pattern region to be printed, that is, outside an integrated circuit pattern formation region in a method of manufacturing a semiconductor integrated circuit, a criterion mark for aligning with an inspection machine and a mark pattern such as a character and a symbol for identifying a mask are formed on the metal. At this time, an aperture is formed on the metal, can be also used for a criterion mark and an identification symbol, a metal plate is formed, a pattern is formed with the shifter and a resist on the metal plate and can be also used for a criterion mark and an identification pattern. A second problem is solved by this means.

Third, a problem that a foreign matter is caused when a mask is installed in an inspection machine, lithography equipment and others occurs. In the technique described above, as a resist of a mask is directly touched to a mask fixing member (for example, a vacuum chuck) of an inspection machine, lithography equipment and others when the mask is installed the inspection machine, the lithography equipment and others and is carried, a foreign matter is caused because the resist chips or is chipped. There is a problem that as this foreign matter adheres to the surface of a lens of the inspection machine and the lithography equipment, contaminates a chamber and adheres to the surface of a semiconductor wafer for example, the inspection accuracy and the dimension accuracy of a pattern are deteriorated and as failure such as the short circuit of a pattern and the failure of an open circuit occur, the reliability and the manufacturing yield of a semiconductor device are deteriorated.

To solve this problem, these inventors proposed that when a photomask was installed in predetermined equipment such as the inspection machine and the lithography equipment and was carried, a photomask in which a light shielding pattern was arranged on the principal surface in the center of a mask substrate was used so that the light shielding pattern made of a resist on the mask substrate of the photomask and an installing part of the predetermined equipment are not touched. These inventors also proposed that when a photomask was installed in predetermined equipment, predetermined processing was executed in a state in which an installing part of the predetermined equipment was touched to a region (that is, the periphery) in which no light shielding pattern made of a resist exists on the principal surface of a mask substrate of the photomask. The third problem is solved by these means.

BRIEF DESCRIPTION OF THE DRAWINGS (a) in FIG. 1 is a sectional view showing a phase shift mask in a representative example of the invention and (b) in FIG. 1 shows a projection exposure method using the phase shift mask shown in (a) of FIG. 1;

(a) to (e) in FIG. 2A are sectional views every process showing the manufacturing process of the mask;

(f) to (j) in FIG. 2B are sectional views every process showing the manufacturing process of the mask;

(k) to (m) in FIG. 2C are sectional views every process showing the manufacturing process of the mask;

(a) to (e) in FIG. 3A are sectional views every process showing the manufacturing process of another mask;

(f) to (i) in FIG. 3B are sectional views every process showing the manufacturing process of another mask;

Figure 1:
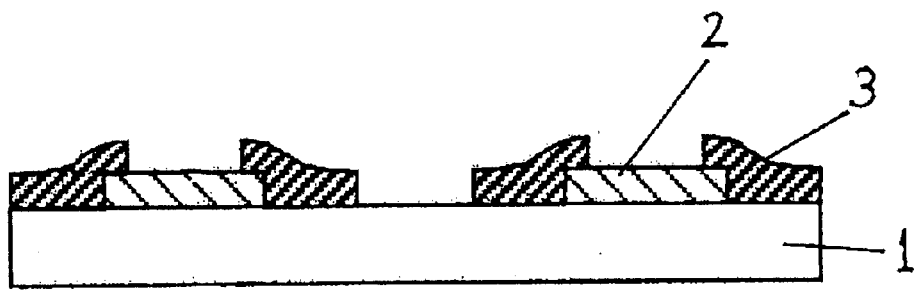
Figure 1:
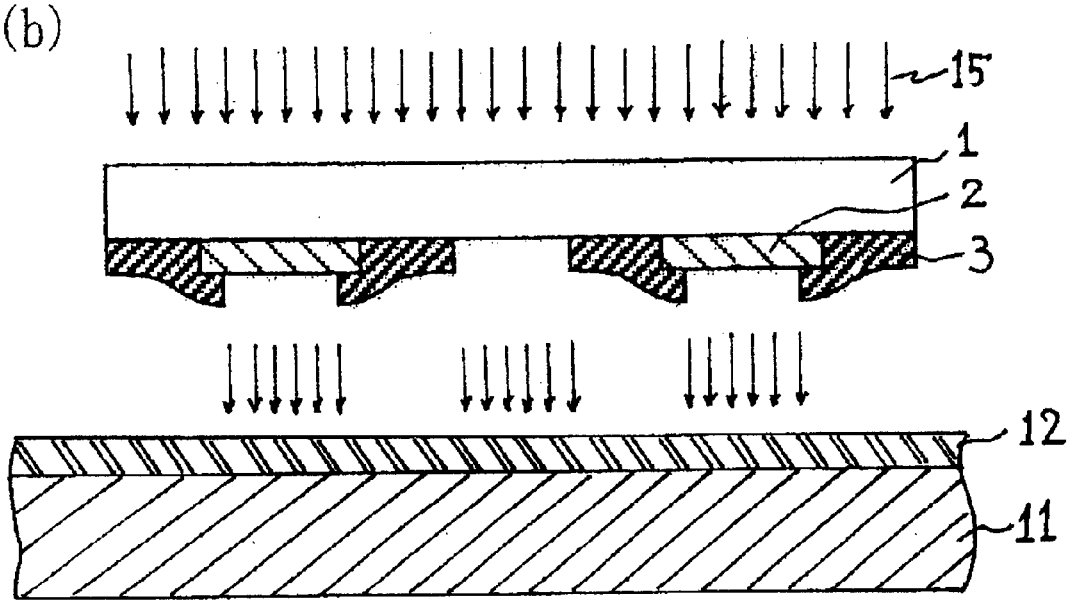
Figure 2A:
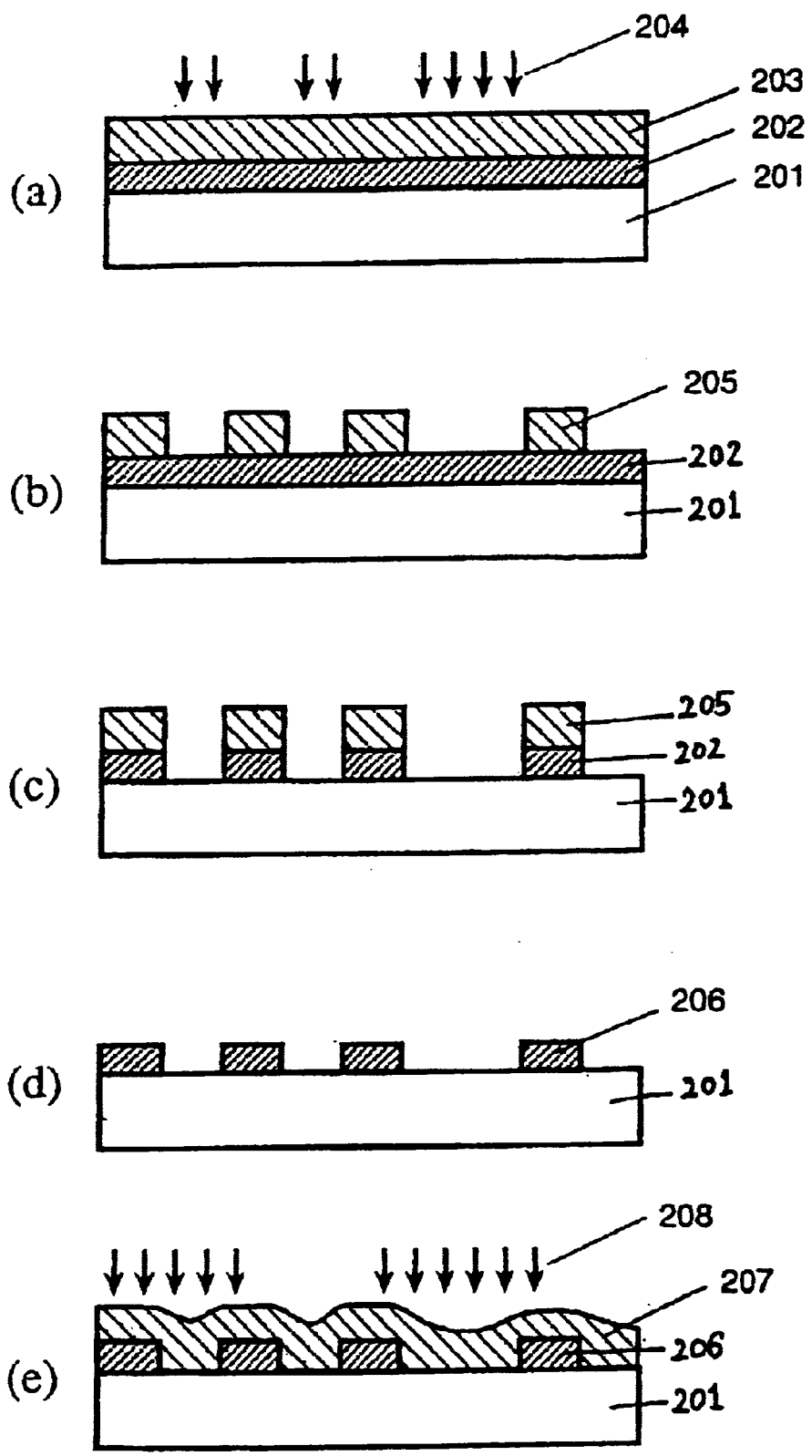
Figure 2B:
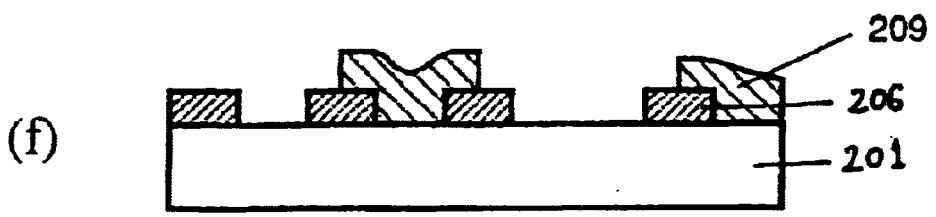
Figure 2B:
Figure 2B:
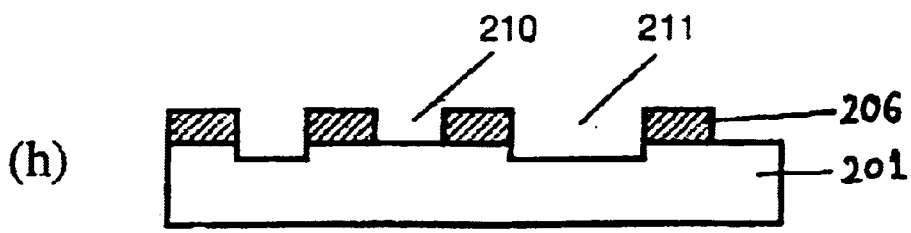
Figure 2B:
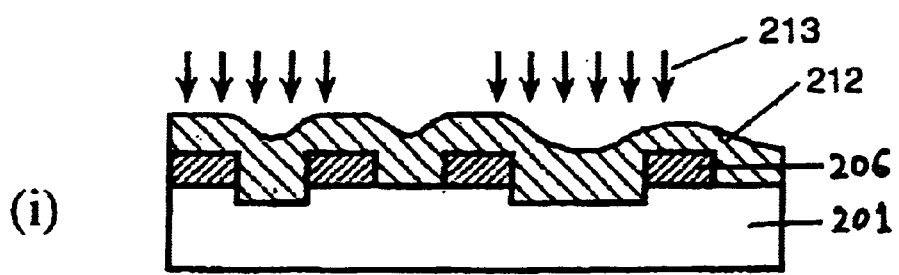
Figure 2B:
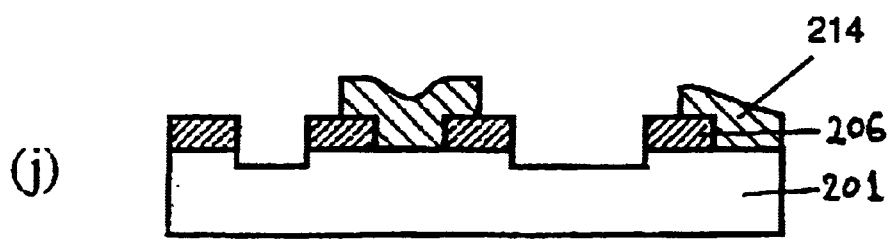
Figure 2C:
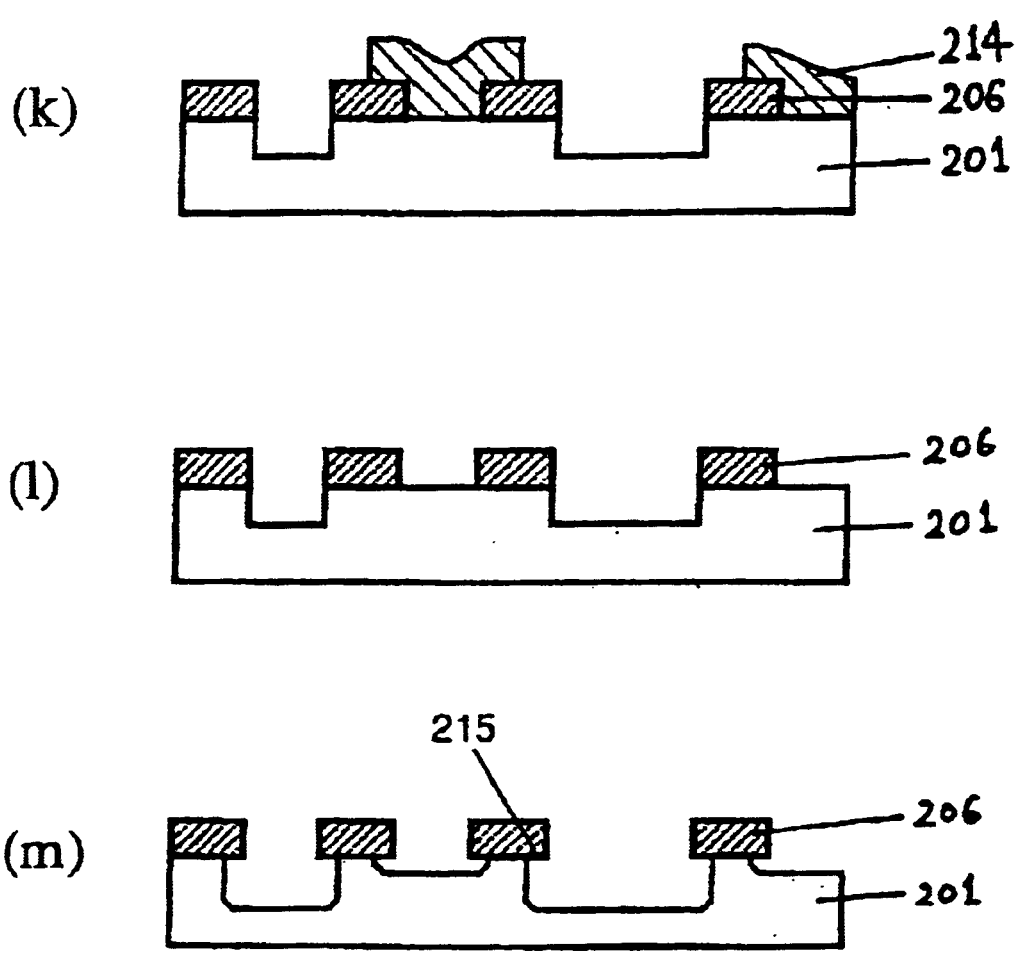
Figure 3A:
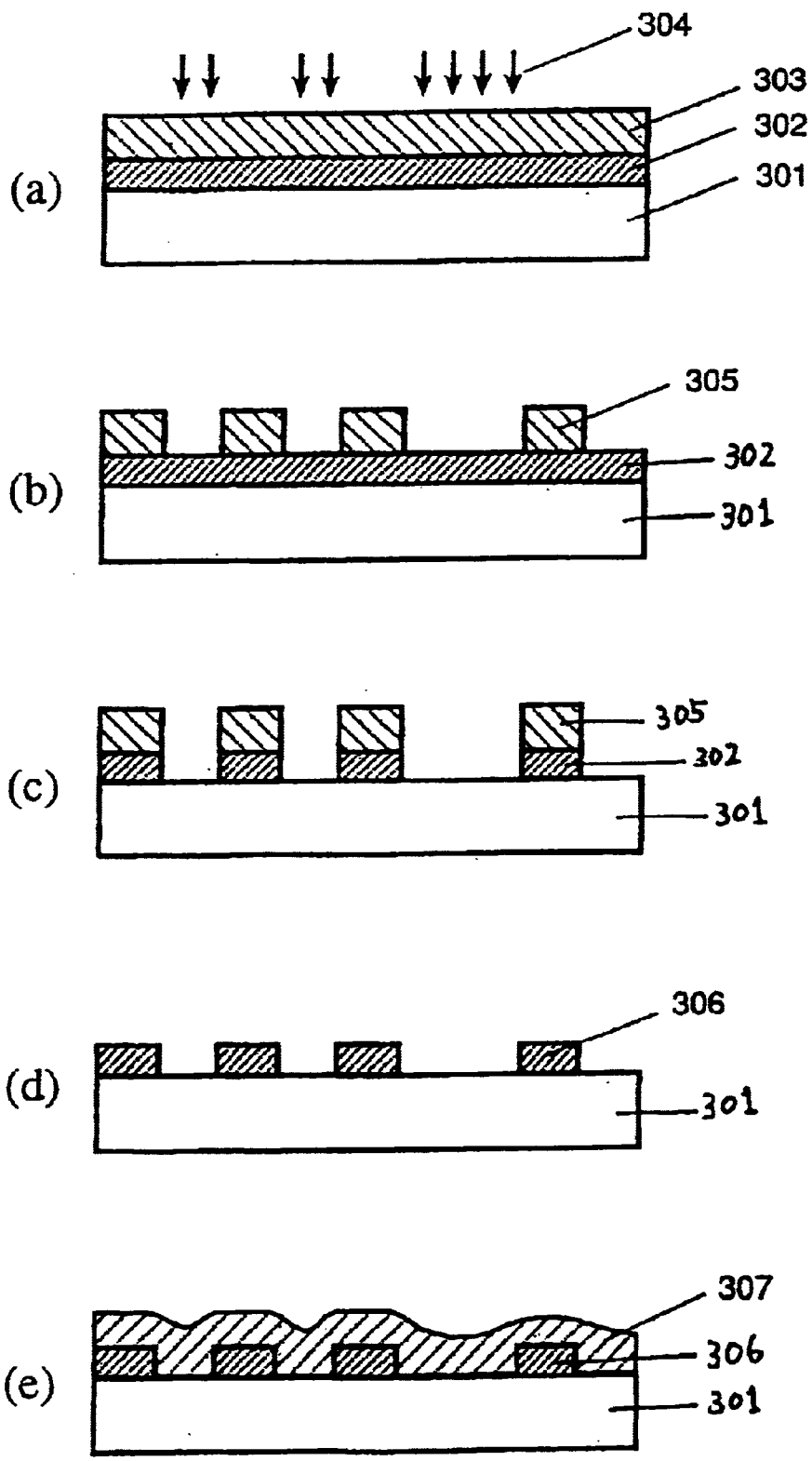
Figure 3B:
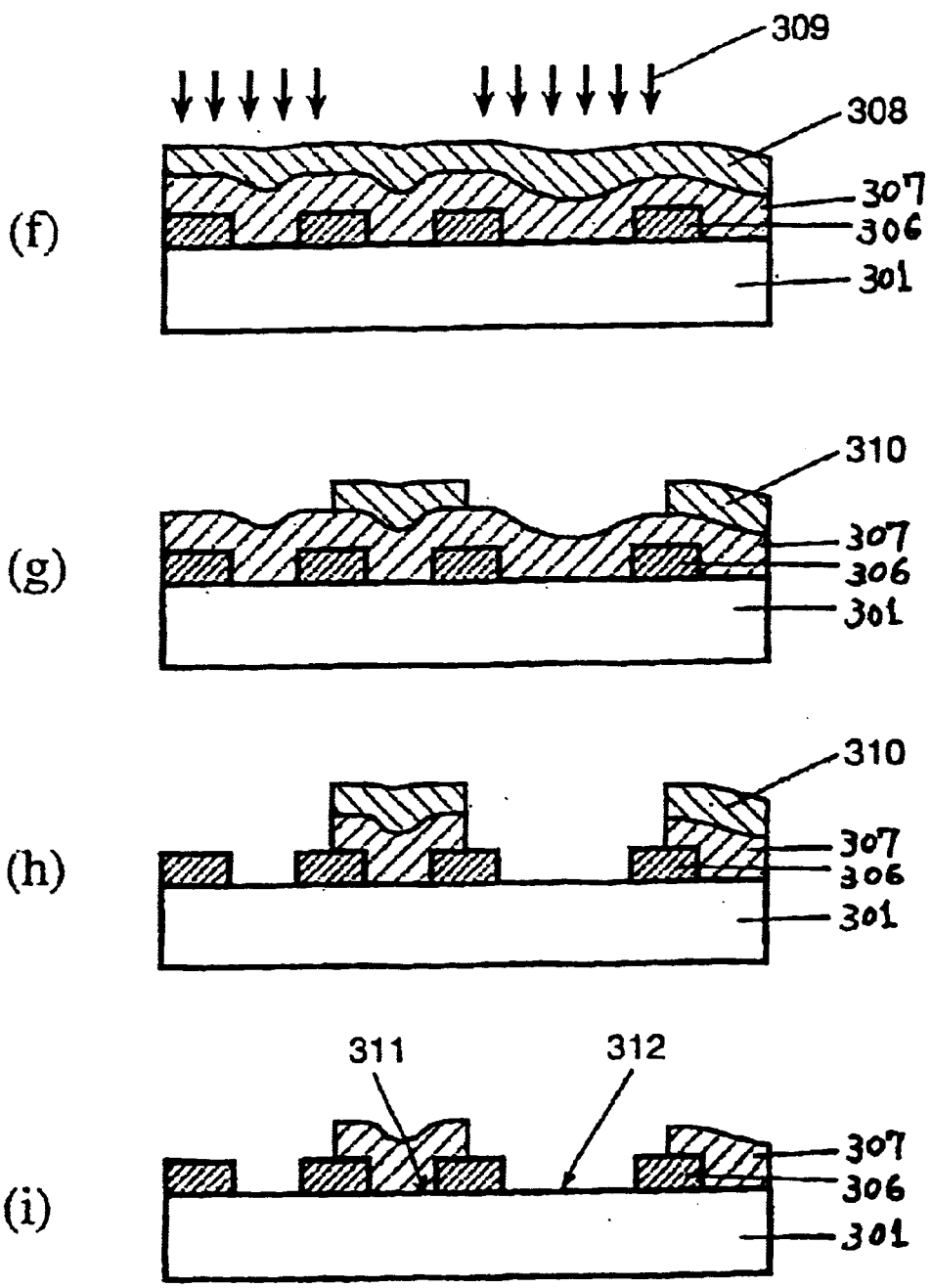
Figure 4:
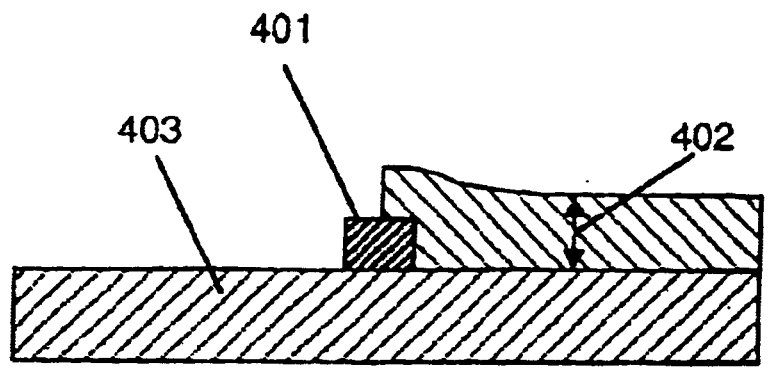
FIG. 4 is a sectional view showing the main part of a mask for showing an example in which the phase shift mask is applied.
Figure 5:
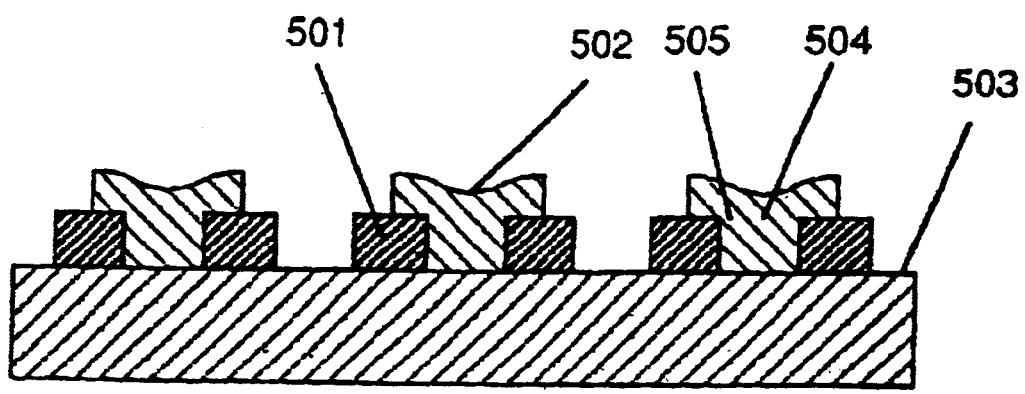
FIG. 5 is a sectional view showing the main part of a mask for showing another example in which the phase shift mask is applied.
Figure 6:
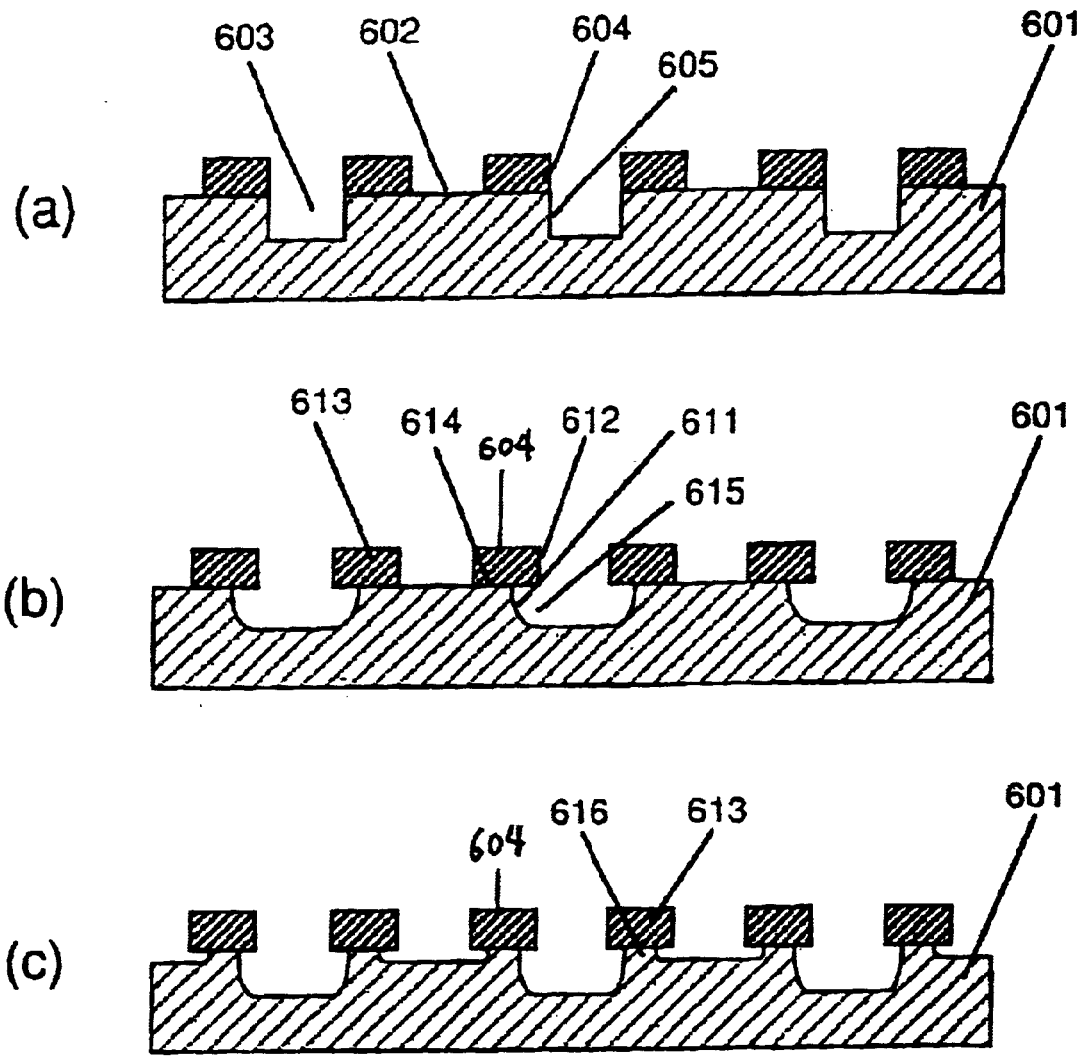
Figure 7A:
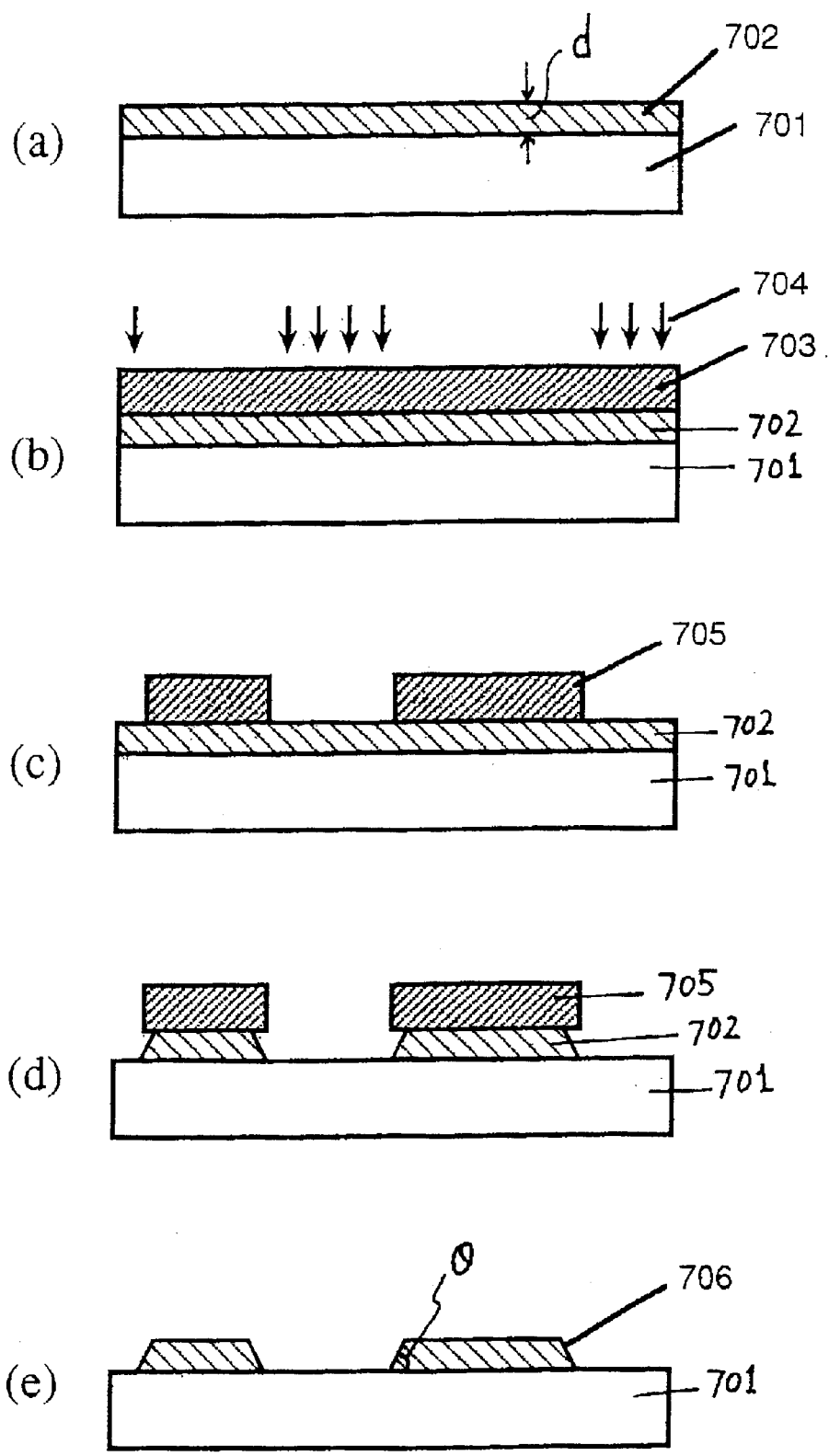
Figure 7B:
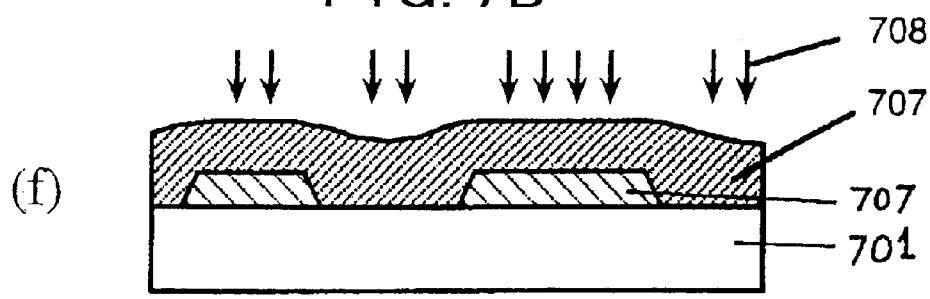
Figure 8:
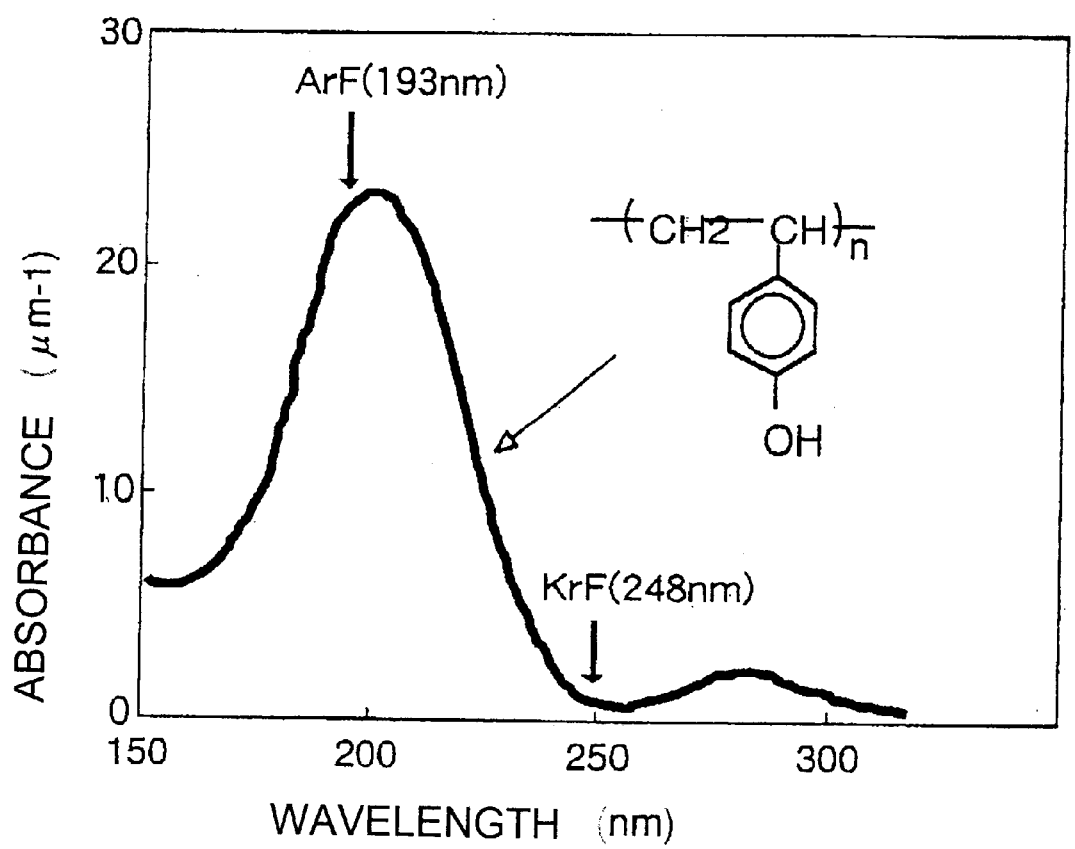
Figure 9A:
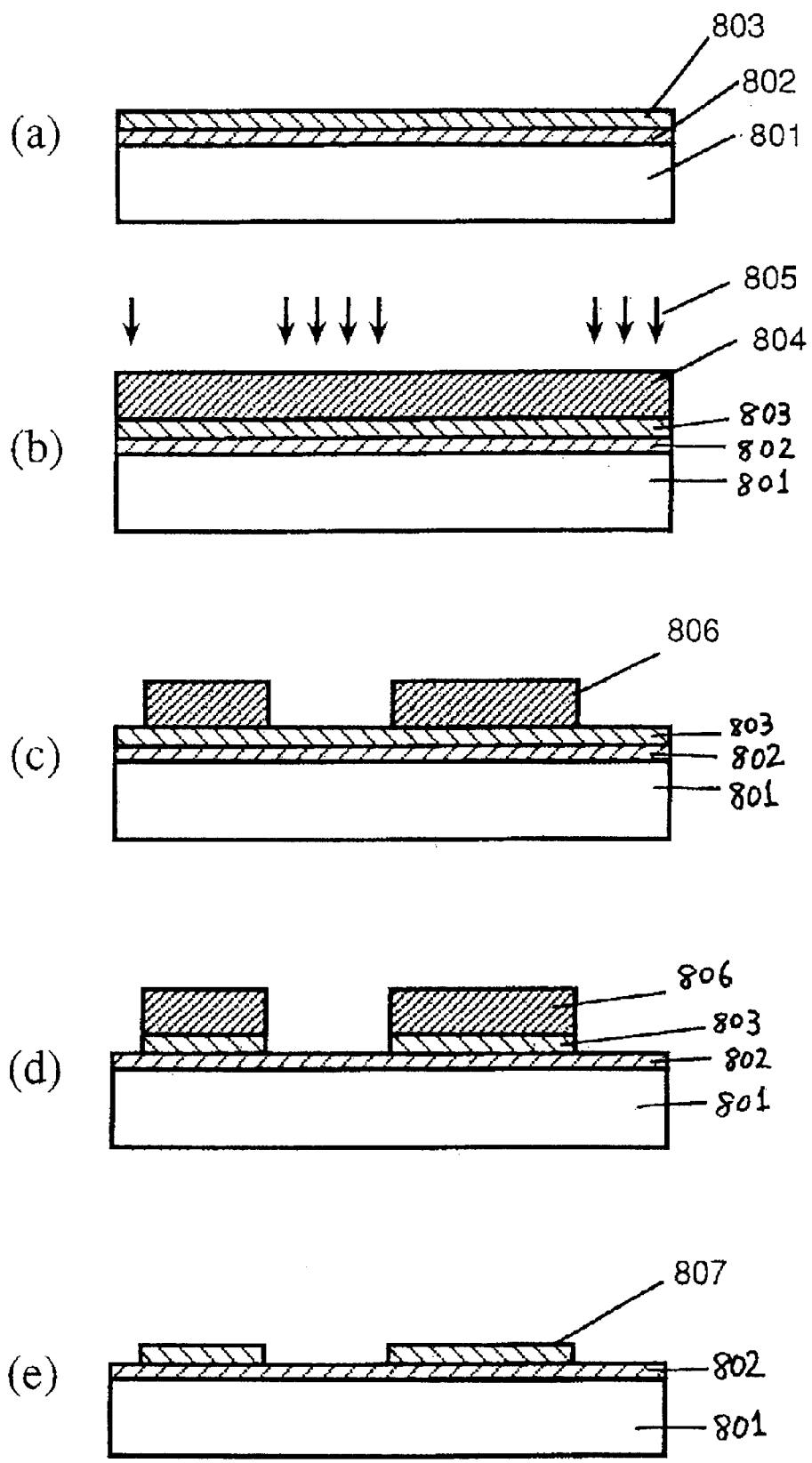
Figure 9B:
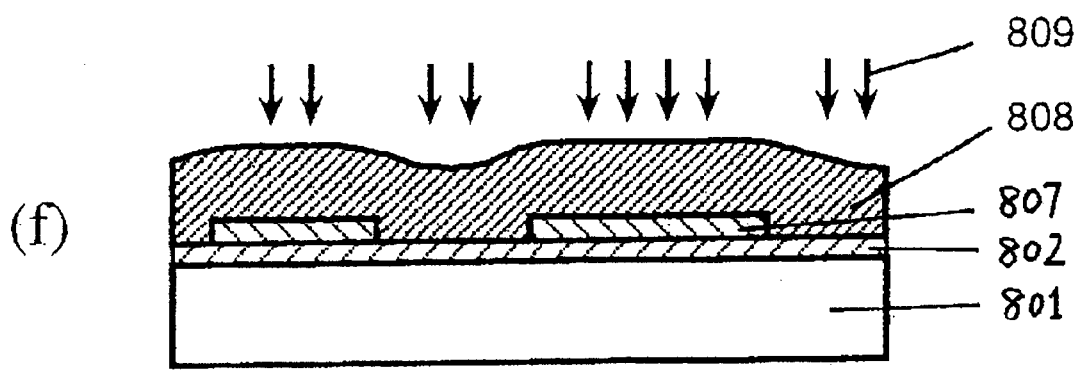
Figure 9B:
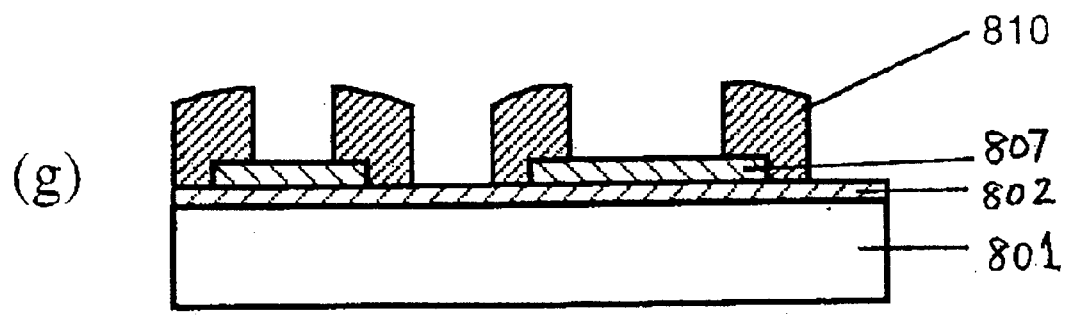
Figure 10:
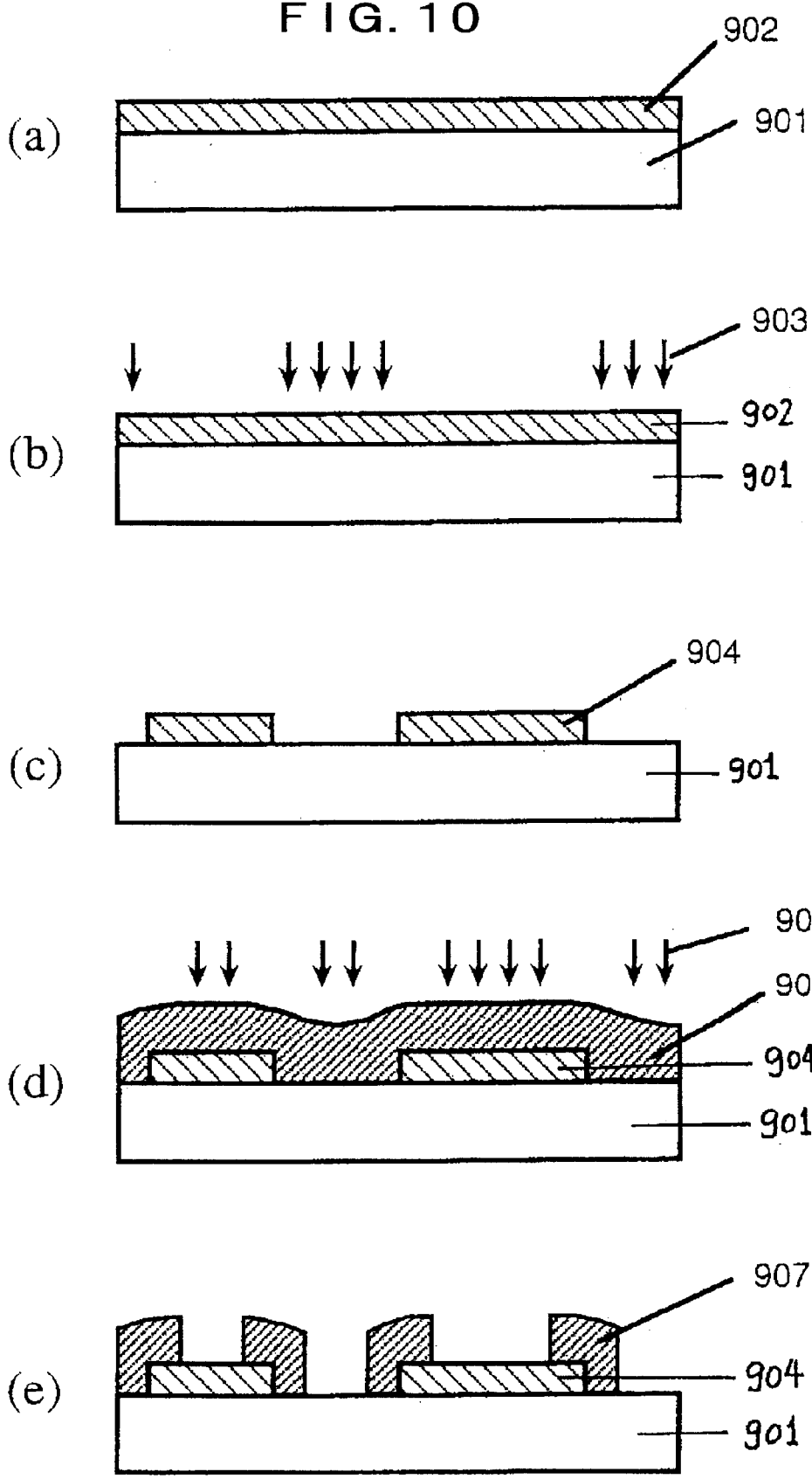
Figure 11A:
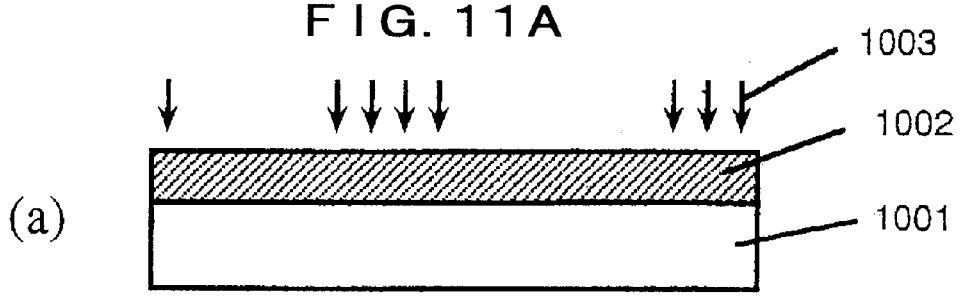
Figure 11A:
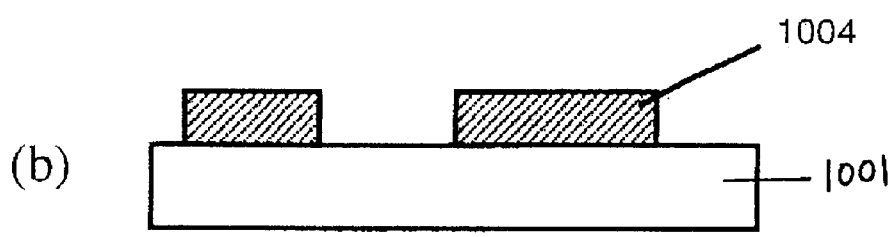
Figure 11A:
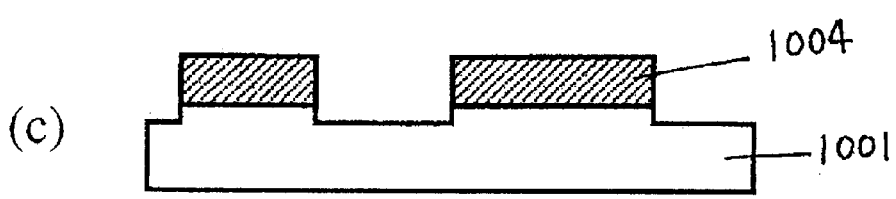
Figure 11A:
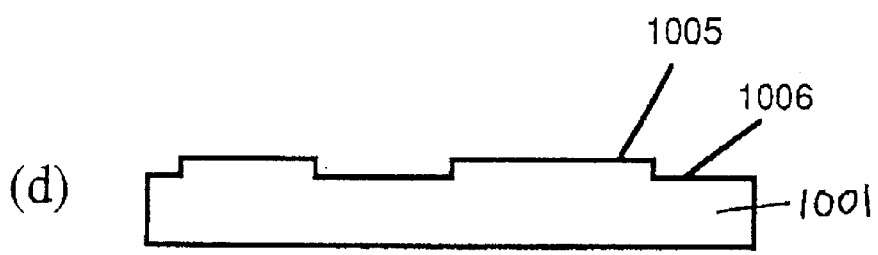
Figure 11A:
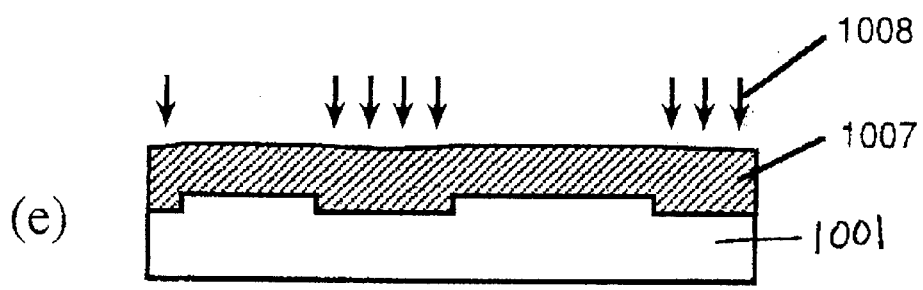
Figure 12:
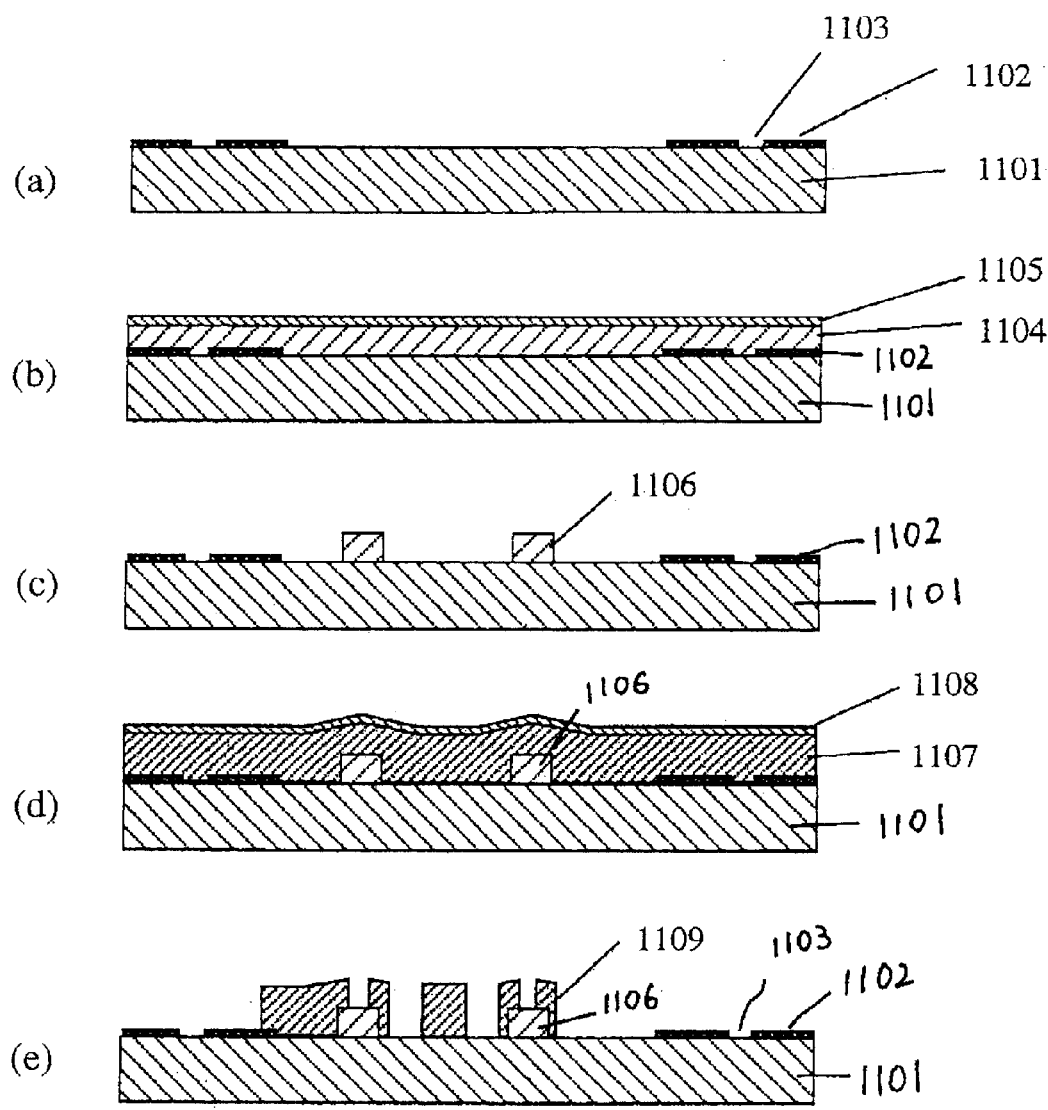
Figure 13:
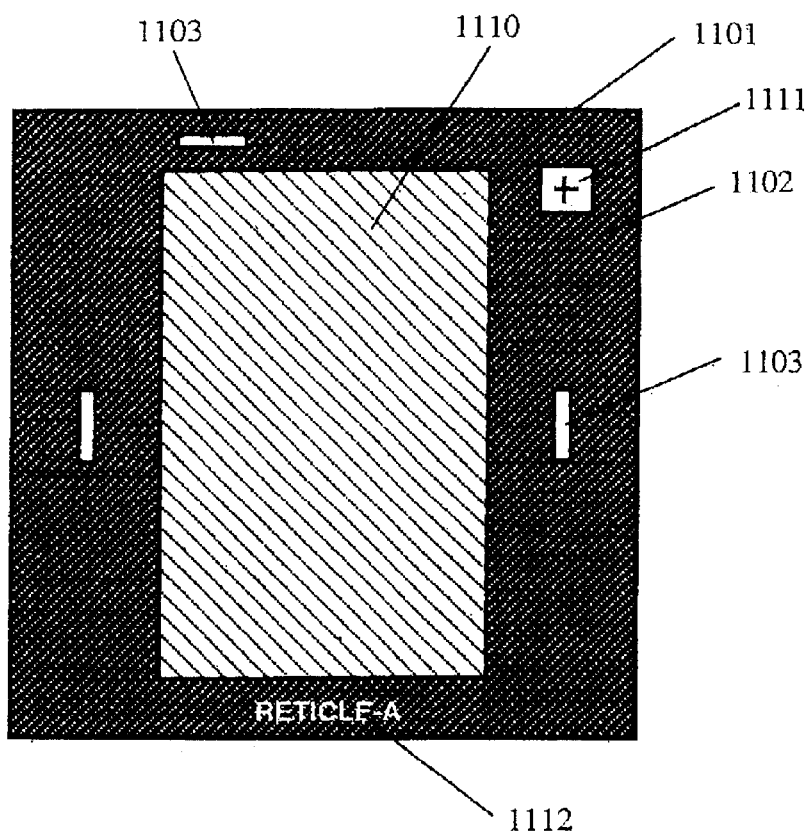
Figure 13:
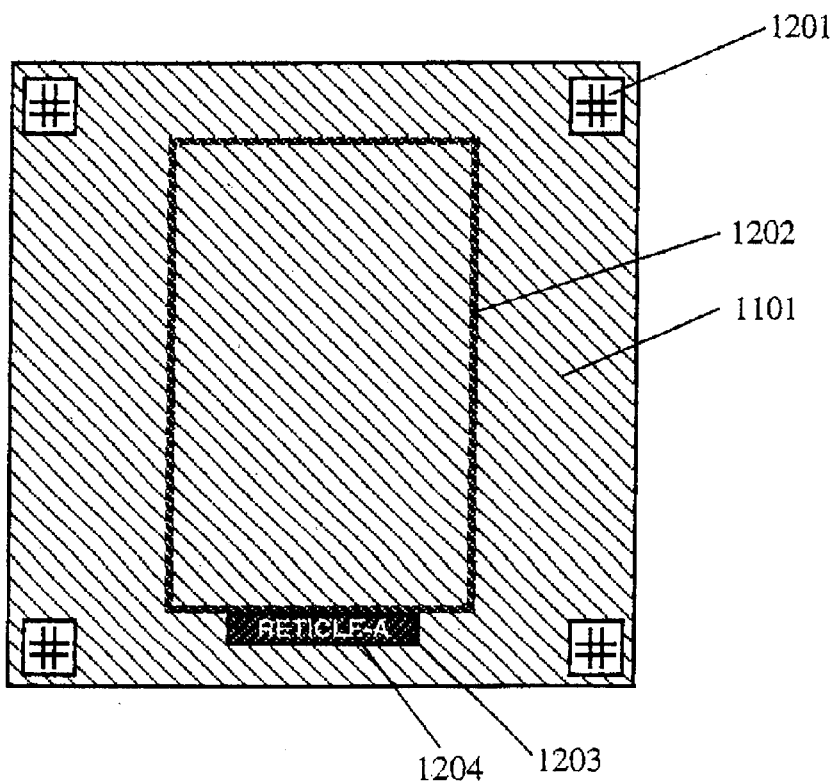
Figure 14:
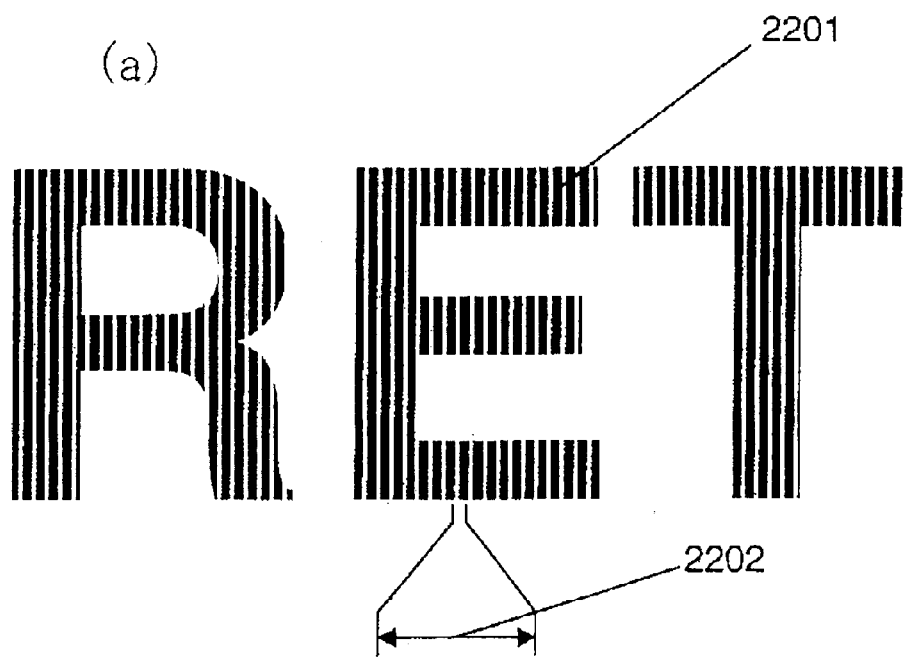
Figure 14:
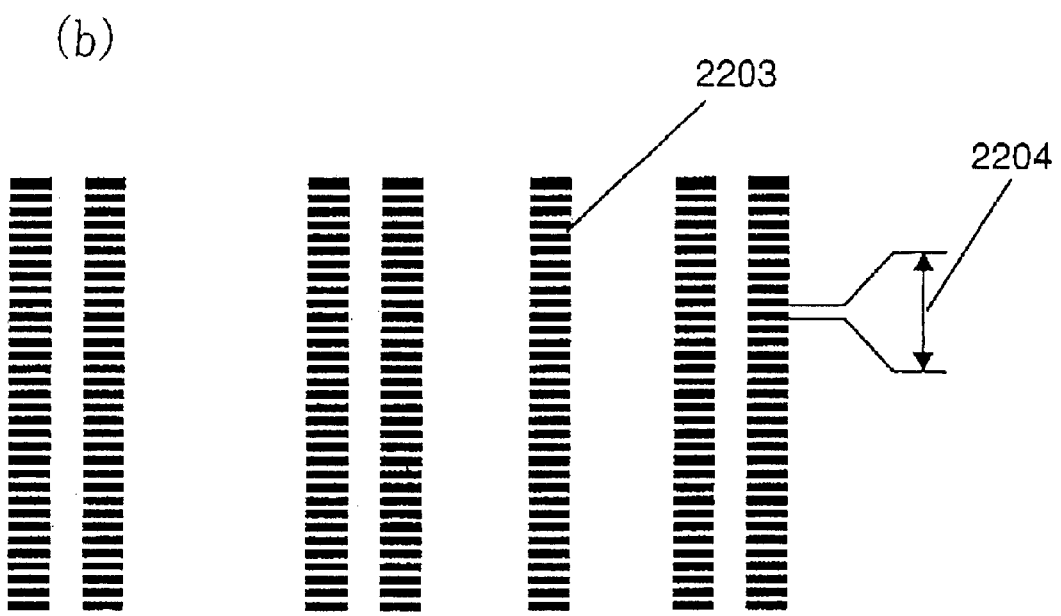
Figure 15:
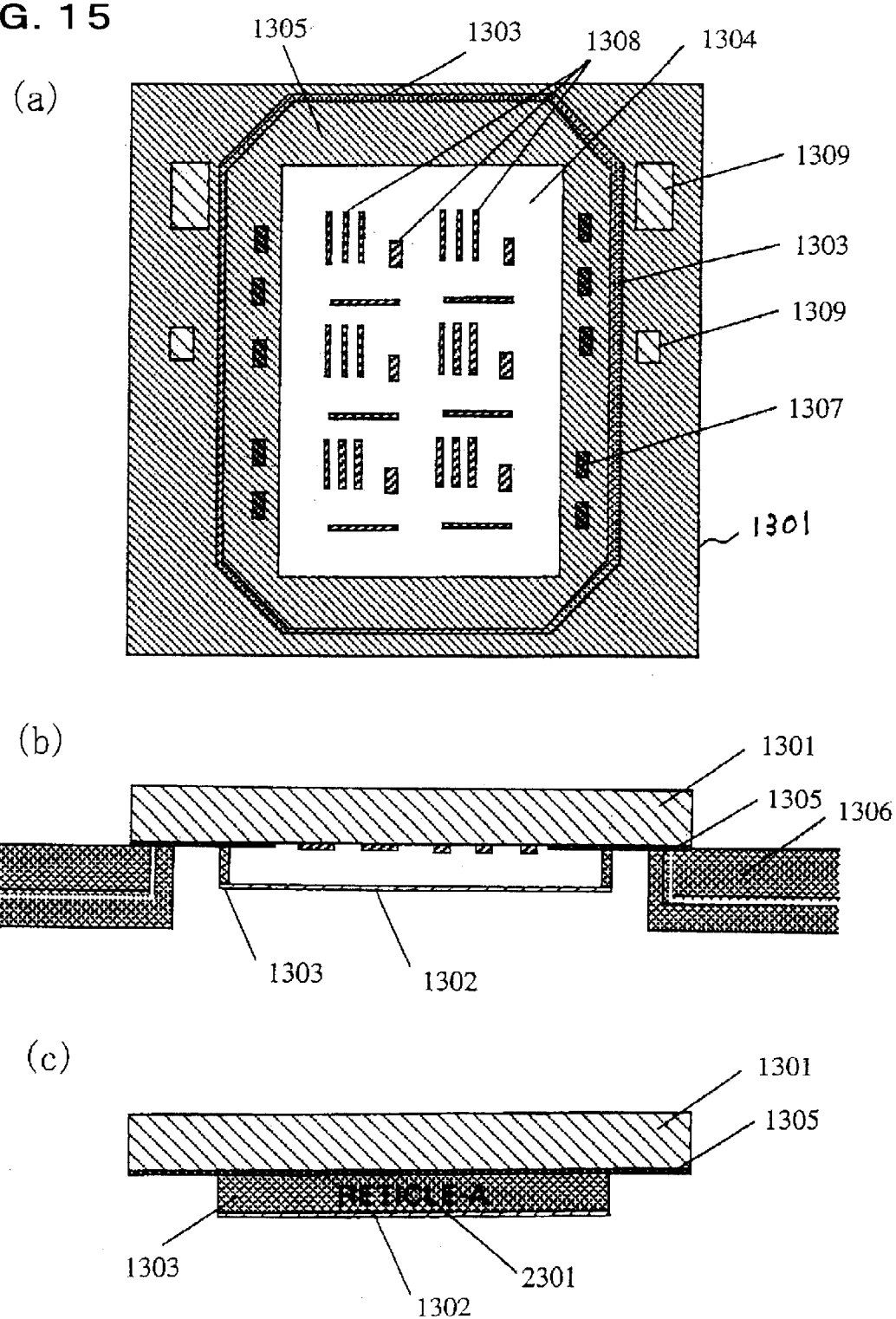
Figure 16:
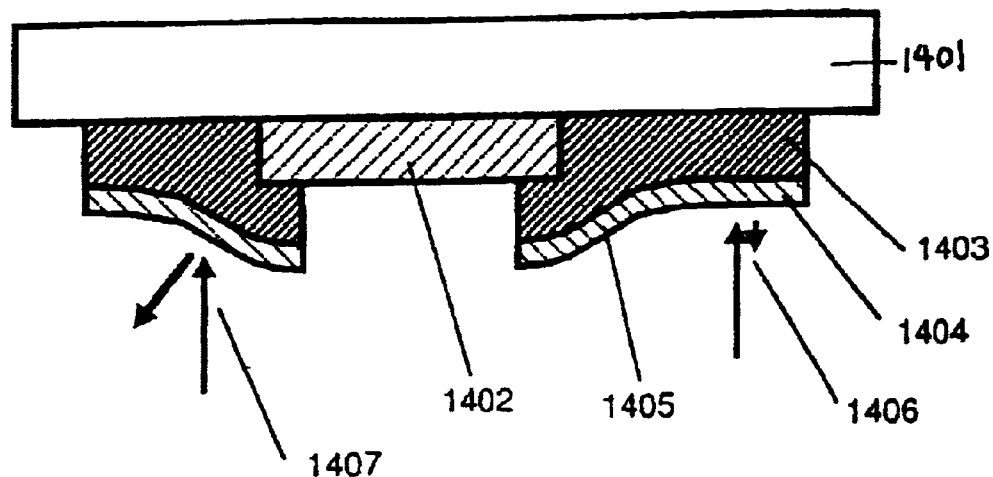
Figure 17:
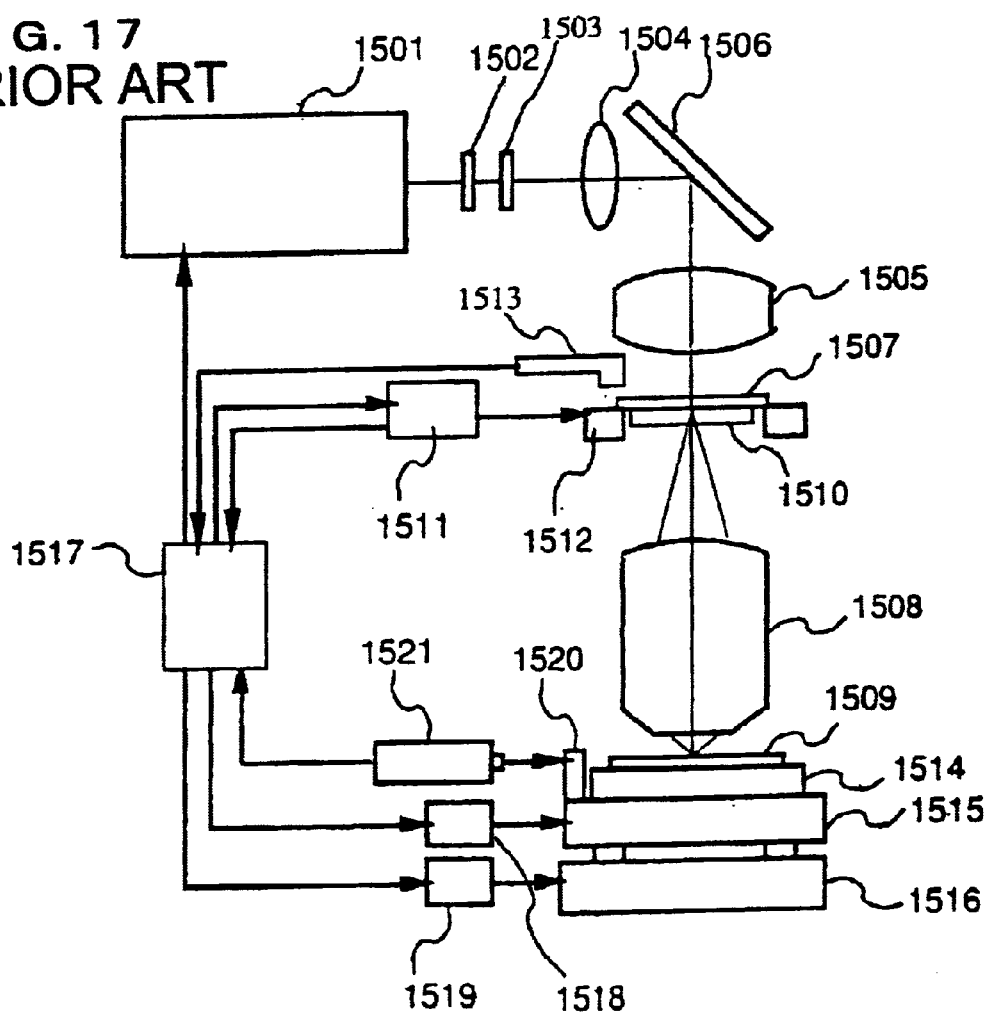
Figure 18:
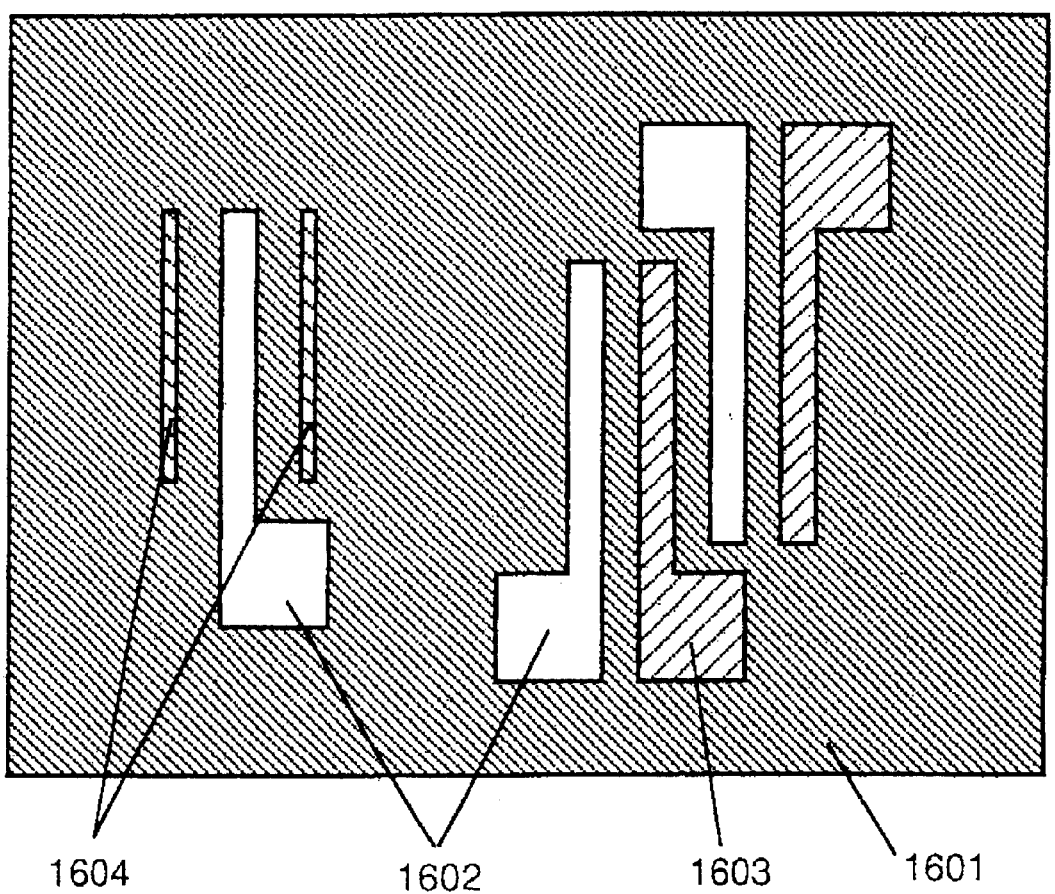
Figure 19:
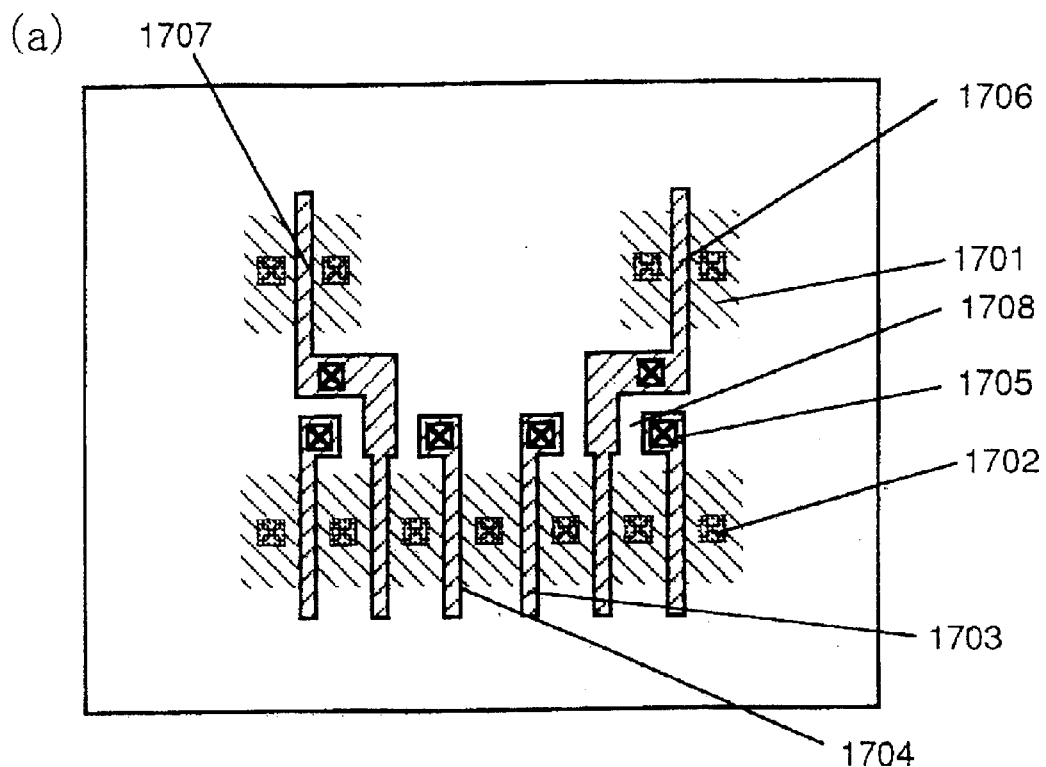
Figure 19:
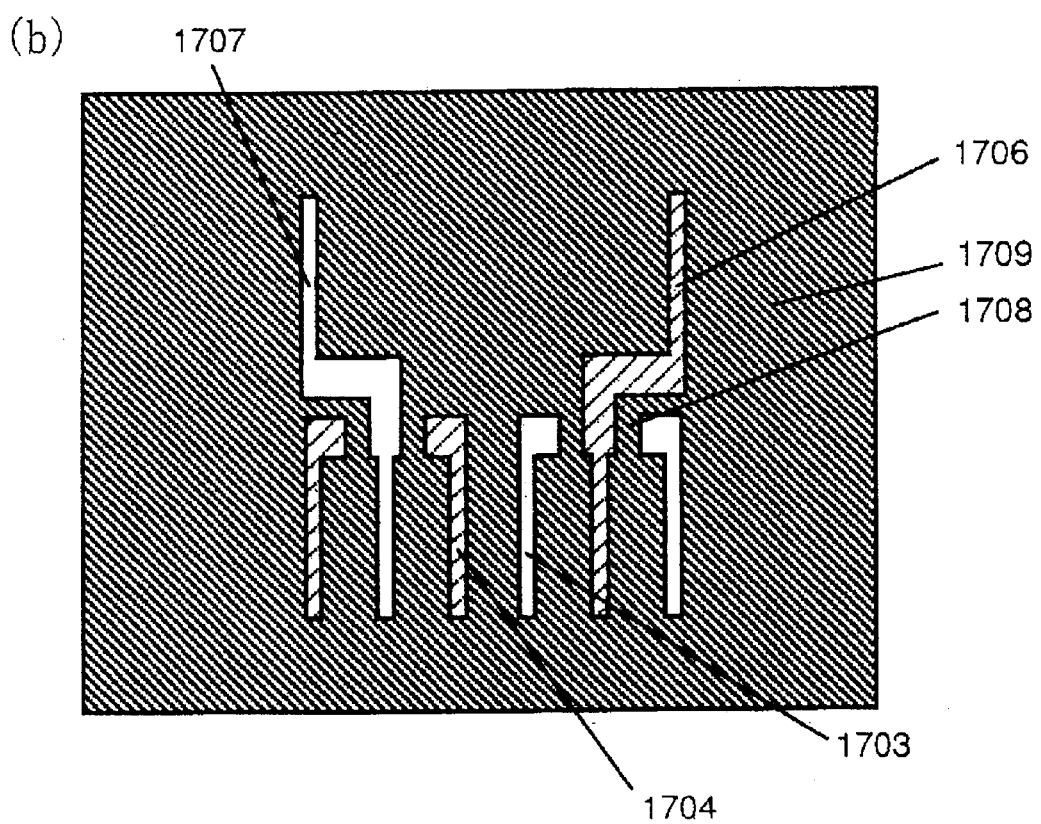
Figure 20:
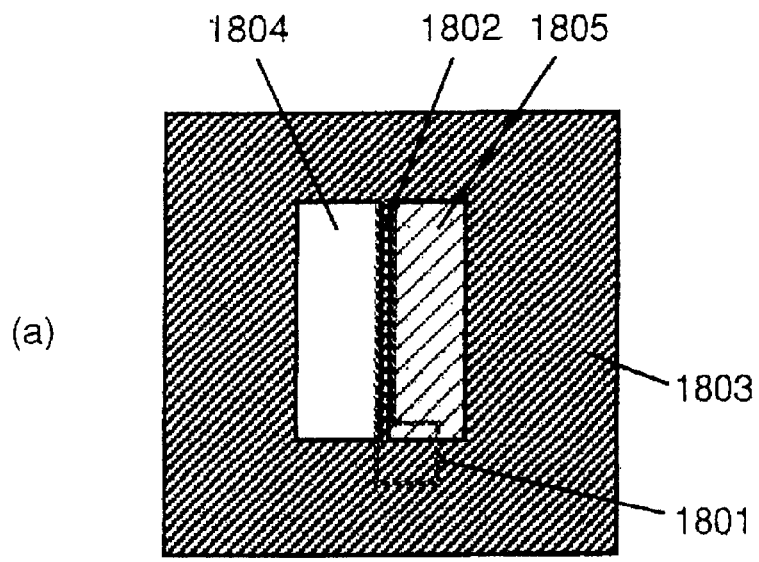
Figure 20:
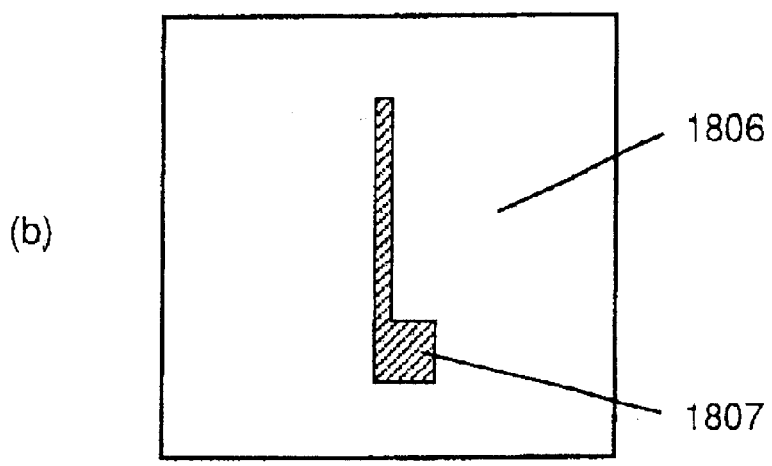
Figure 20:
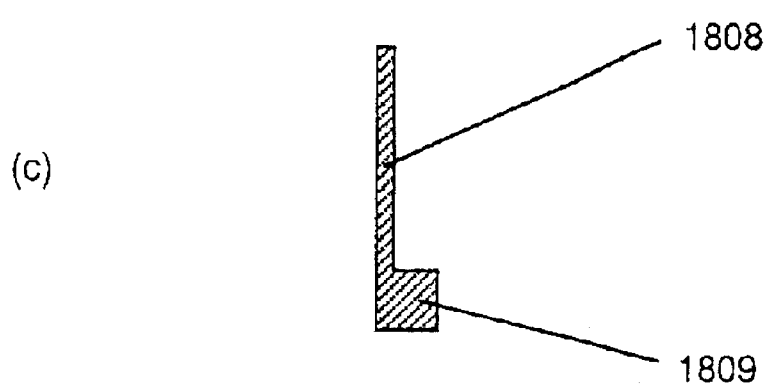
Figure 21:
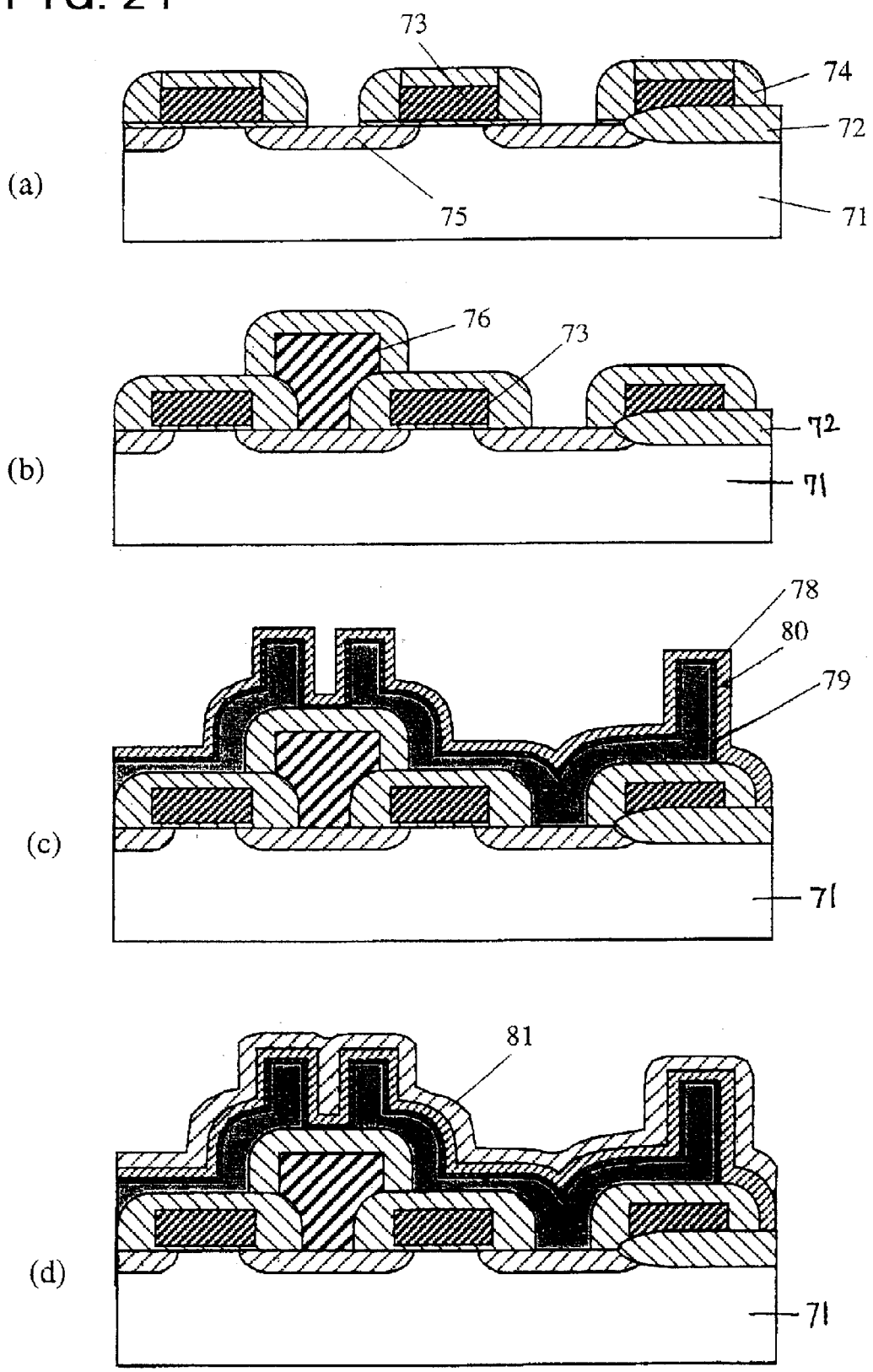
Figure 22:
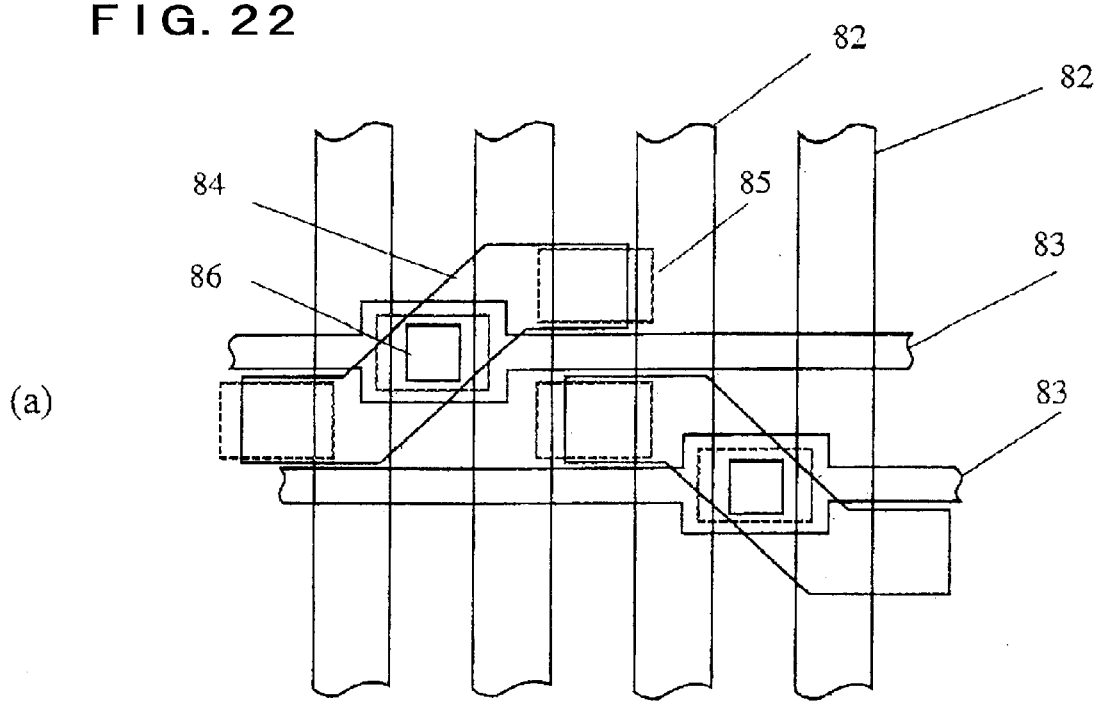
Figure 22:
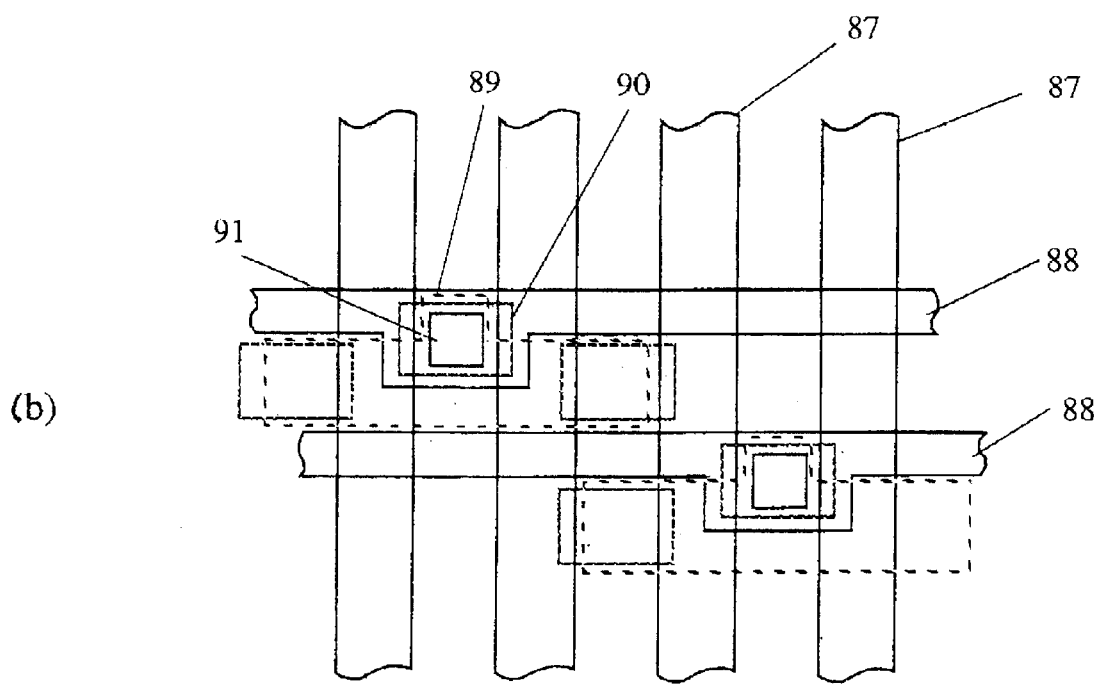
Figure 23:
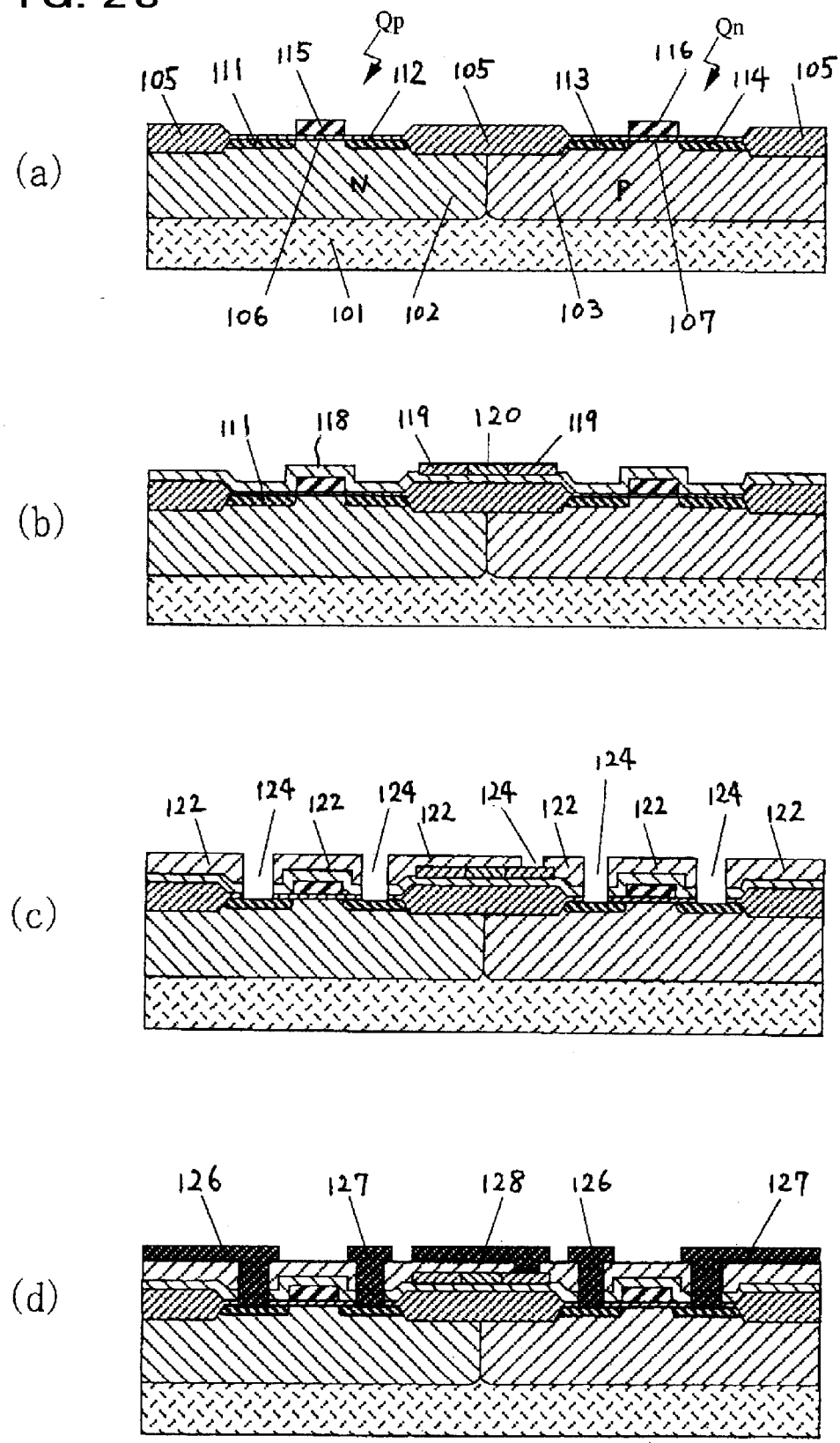
Figure 24:
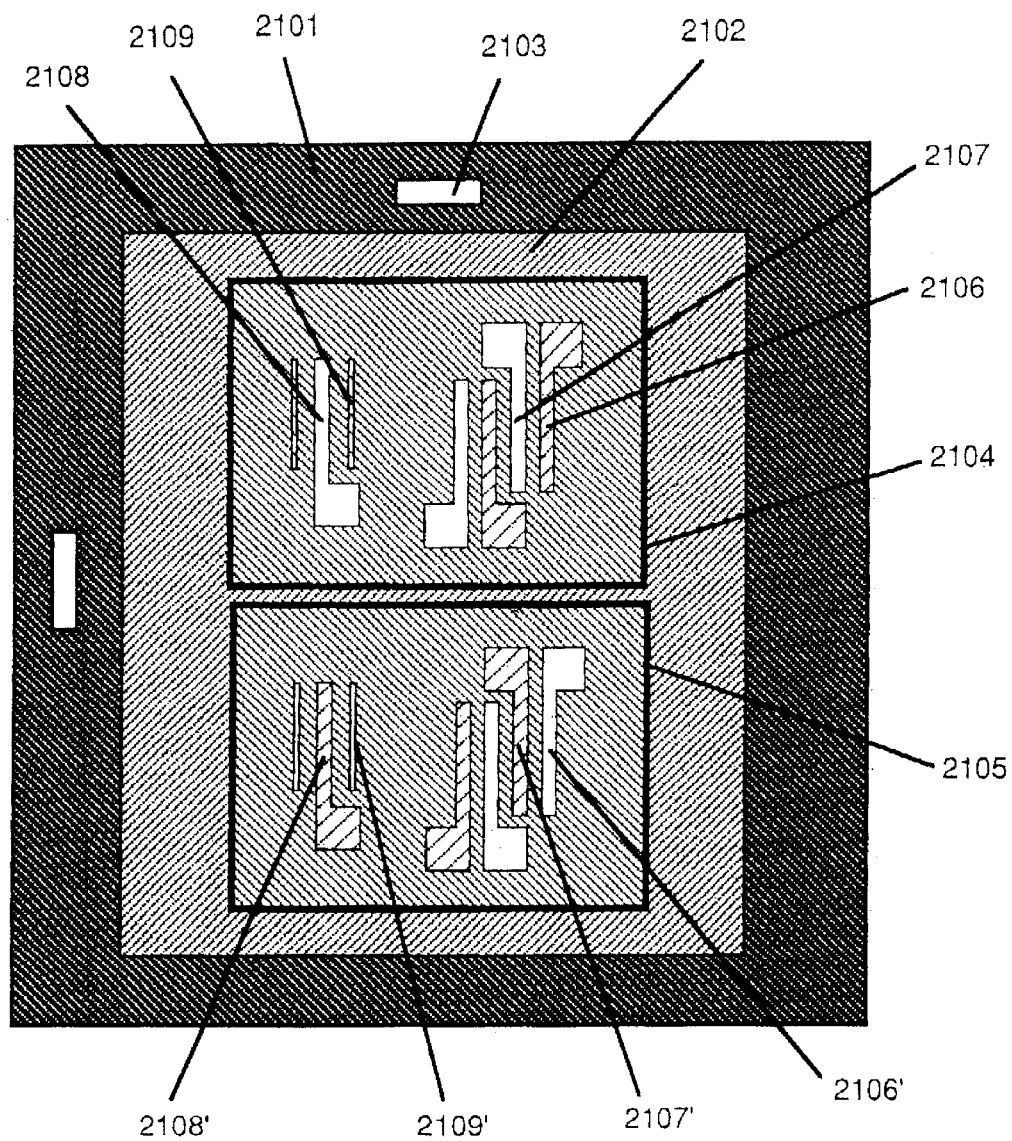

(a) to (c) in FIG. 6 are sectional views showing the main part of a mask for explaining the problem of the phase shift mask;

(a) to (e) in FIG. 7A are sectional views every process showing the main part and the manufacturing process of the phase shift mask equivalent to a first embodiment of the invention;

(f) and (g) in FIG. 7B are sectional views every process showing the main part and the manufacturing process of the phase shift mask equivalent to the first embodiment of the invention;

FIG. 8 is a graph showing an optical absorption characteristic of photoresist material;

(a) to (e) in FIG. 9A are sectional views every process showing the main part and the manufacturing process of a phase shift mask equivalent to a second embodiment of the invention;

(f) and (g) in FIG. 9B are sectional views every process showing the main part and the manufacturing process of the phase shift mask equivalent to the second embodiment of the invention;

(a) to (e) in FIG. 10 are sectional views every process showing the main part and the manufacturing process of a phase shift mask equivalent to a third embodiment of the invention;

(a) to (e) in FIG. 11A are sectional views every process showing the main part and the manufacturing process of a phase shift mask equivalent to a fourth embodiment of the invention;

(f) to (j) in FIG. 11B are sectional views every process showing the main part and the manufacturing process of the phase shift mask equivalent to the fourth embodiment of the invention;

(a) to (e) in FIG. 12 are sectional views every process showing the main part and the manufacturing process of a phase shift mask equivalent to a fifth embodiment of the invention;

(a) and (b) in FIG. 13 are plans showing the main part of a phase shift mask according to the invention;

(a) and (b) in FIG. 14 are plans showing a pattern such as a character, a symbol and a mark provided to the phase shift mask according to the invention;

(a) in FIG. 15 is a plan showing the main part of a phase shift mask equivalent to a sixth embodiment of the invention, (b) in FIG. 15 is a sectional view showing the main part and a state in which the mask is installed in equipment, and (c) in FIG. 15 is a side view showing the mask;

FIG. 16 is a sectional view showing the main part of a mask for explaining the problem of the phase shift mask;

FIG. 17 is a schematic drawing showing the outline of lithography equipment used in the invention;

FIG. 18 is a plan showing the main part and a mask pattern layout equivalent to a seventh embodiment of the invention;

(a) in FIG. 19 is a plan showing the main part and the layout of an electronic circuit pattern equivalent to an eighth embodiment of the invention and (b) in FIG. 19 is a plan showing a phase shift mask for the electronic circuit pattern;

(a) in FIG. 20 is a plan showing a phase shift mask equivalent to a ninth embodiment of the invention, (b) in FIG. 20 is a plan showing a binary mask, and (c) in FIG. 20 is a plan showing a pattern formed by printing;

(a) to (d) in FIG. 21 are sectional views every process showing the main part and the manufacturing process of a semiconductor memory circuit equivalent to a tenth embodiment of the invention;

(a) and (b) in FIG. 22 are plans showing the main part for explaining a circuit layout pattern in the semiconductor memory;

(a) to (d) in FIG. 23 are sectional views every process showing the main part and the manufacturing process of a semiconductor logical circuit equivalent to an eleventh embodiment of the invention; and FIG. 24 is a plan showing the main part of a phase shift mask equivalent to a twelfth embodiment of the invention.

DESCRIPTION OF THE PREFERRED EMBODIMENTS

Before the invention is detaieldy described, the meaning of terms in the invention is as follows. 1. A device face means a principal surface of a semiconductor wafer and a device pattern corresponding to plural semiconductor chip regions is formed on the surface by photolithography. 2. A semiconductor integrated circuit wafer (a semiconductor integrated circuit substrate) or a semiconductor wafer (a semiconductor substrate) means a silicon monocrystalline substrate (generally substantially flat and circular) used for manufacturing a semiconductor integrated circuit, a sapphire substrate, a glass substrate, other insulating, conductive or semiconductor substrates and a their composite substrate. 3. An organic spin-on-glass (SOG) film means an insulating film formed by dissolving polymeric resin in which various organic functional groups are generally bonded to a siloxane polymer or a copolymer with another monomer in a solvent and applying it to a substrate by spinning. The organic SOG film is generally characterized in that as it is more hardly cracked after a cure, compared with an inorganic SOG film, it can be formed with it thicker. As the organic film may be formed by chemical vapor deposition (CVD), it is called only an organic siloxane insulating film in that case. 4. An etching stopper means the one the etching selection ratio of an etched film to an etching stopper film of which is 4 or more in principle (that is, in case the etching selection ratio of A to B is X, the etching rate of A is X and the etching rate of B is 1). An applied stopper film and others are included in the etching stopper film. 5. A masking layer generally means a resist film, however, it also includes an inorganic mask and a non-photosensitive organic mask. 6. "Light shielding" used in a light shielded region, a light shielding film and a light shielding pattern means a case provided with an optical characteristic that light smaller than 40% (30% in a narrow sense) of exposure light radiated on the region is transmitted. In the meantime, "transparent" means a case provided with an optical characteristic that light exceeding 60% (90% in a narrow sense) of exposure light radiated on a region is transmitted. 7. A photoresist pattern means a film pattern acquired by patterning a photosensitive organic film by photolithography. This pattern includes a mere resist film having no aperture. 8. The pattern face of a mask is classified into an integrated circuit pattern formation region: a region in which an integrated circuit pattern to be printed is arranged, a pellicle covered region: a region covered with a pellicle, an integrated circuit pattern peripheral region: a pellicle covered region except the integrated circuit pattern formation region, a peripheral region: an external region not covered with a pellicle, a peripheral inner region: an inner region in which an optical pattern is formed in the peripheral region and a peripheral outer region: a region used for vacuum absorption and others in the other peripheral region. 9. Ultraviolet rays are classified in the field of a semiconductor into ultraviolet rays in case the wavelength is between approximately 50 nm and approximately 400 nm, near ultraviolet rays in case the wavelength is 300 nm or more, far ultraviolet rays in case the wavelength is between 200 nm and 300 nm and vacuum ultraviolet rays in case the wavelength is below 200 nm. In main embodiments of the invention, vacuum ultraviolet rays the wavelength of which is below 200 nm is used, however, it need scarcely be said that in case a change described in a second embodiment is made, far ultraviolet rays by a KrF excimer laser the wavelength of which is between 200 nm and 250 nm can be also applied. The principle in the invention can be similarly applied with a shorter wavelength region of ultraviolet rays the wavelength of which between 50 nm and 100 nm. 10. When mask materials are called "metal", they mean a compound of chromium, chromium oxide and other metal and include a simple substance including a metallic element, a compound and a complex respectively having light shielding action in a wide sense. 11. Levenson type phase shift mask means one type of a phase shift mask to acquire a vivid image by interference by alternately inverting the phase of adjacent apertures separated by a light shielded region.

The following various embodiments are respectively divided into plural sections if necessary, however, except a specified case, the sections are not unrelated and one section is a part of the others or is a transformed example, the detailed description and the supplementary description of all. In the following various embodiments, in case the number of elements (including the number of pieces, a numerical value, quantity and a range) is referred, the invention is not limited to the specific number except a specified case and a case that the number of elements is clearly limited to a specific number and the number of elements may be also larger or smaller than the specific number. Further, in the following various embodiments, it need scarcely be said that a component (including an element step) is not necessarily essential except a specified case and a case in which the component is clearly considered to be essential. Similarly, in the following various embodiments, when the form and the positional relation of a component and others are referred, a form and others substantially close to or similar to the form and others are included except a specified case and a clearly different case. This is also similar as to a numerical value and a range.

In the invention, a semiconductor integrated circuit includes not only the one formed on a semiconductor or insulator substrate such as a silicon wafer and a sapphire substrate but the one formed on a glass or other insulating substrate such as a thin film transistor (TFT) and a supertwisted nematic (STN) liquid crystal except a case in which different material is specified.

Referring to the drawings, various embodiments of the invention will be described in detail below.

First Embodiment (a) to (e) in FIG. 7A and (f) and (g) in FIG. 7B are sectional views every process showing the main part for explaining a method of manufacturing a phase shift mask equivalent to one embodiment of the invention.

First, as shown in (a) of FIG. 7A, a phase shifter 702 is formed on the flat principal surface of a quartz glass substrate (blanks) 701. The thickness d is set so that $d=\lambda/\{2(n-1)\}$ when the wavelength of exposure light is $\lambda$ and the refractive index of the shifter 702 to the wavelength of exposure light is n. The shifter 702 is formed by $SiO_x$ by sputtering and is not limited to this. Another film that transmits exposure light and is uniform in the thickness and the refractive index can be also used. Particularly, a film made of $SnO_x$ and $TiO_x$ and high in the refractive index is desirable because it can be formed thinly and afterward resist light shielding pattern formation is facilitated. When the refractive index of the film is 1.6 or more, the effect of the thickness appears. As a conductive film is not influenced by the increase of charges when the following resist is written by EB, it is desirable that the shifter itself, or at least the surface or the rear surface is conductive. An ITO film or others is suitable for a conductive film provided to the surface or the rear surface of the shifter. To enhance the durability, after the shifter 701 is deposited, heating processing is executed, however, the set thickness d is equivalent to the thickness after the heating processing. As heating processing, baking at 200° C. for 30 minutes is performed, however, the invention is not limited to this.

As the thickness of the shifter that determines a phase angle is important, the thickness is measured after film formation including heating processing and in case the thickness is not within reference values, the shifter is removed and a shifter is formed again. The allowable value of the dispersion of the thickness is approximately 1% though it depends upon the dimension and required dimension accuracy. As the shifter 702 is deposited on the flat principal surface, the thickness easily becomes uniform and as a problem that a phase angle (the thickness) varies every dimension by micro loading effect in etching does not also occur, high resolution and dimension accuracy can be easily acquired. In this embodiment, for a method of forming the shifter, sputtering is used, however, CVD and an application formation method can be also used. Particularly, the application formation method is characterized in that it is excellent in the uniformity of the thickness and in this case, the shifter can be also formed at the uniformity of 0.2%. This is high accuracy equivalent to approximately 0.1 degree in terms of phase angle shift. The defect (a pin hole defect and a foreign matter defect) of the phase shifter is inspected and in case a defect is detected, the shifter is reproduced. As a measure for a detect to be a phase defect can be taken at an initial stage, the control of a process is facilitated.

Next, as shown in (b) of FIG. 7A, an EB resist 703 is applied to the shifter 702 and a desired pattern is written by EB (704). In case the shifter 702 is not conductive, a water soluble conductive film is formed on the resist 703 and a countermeasure against the increase of charges in writing by EB is taken. When such a countermeasure is not taken, the misregistration of a written pattern is caused because of the increase of charges. In this embodiment, as the conductive film is formed, no misregistration by the increase of charges is not caused. It is found for the conductivity required to prevent the increase of charges that when the sheet resistance is 50 $M\Omega/cm^2$ or less, sufficient effect is acquired.

Next, as shown in (c) of FIG. 7A, a resist pattern 705 is formed by development and afterward, as shown in (d) of FIG. 7A, the shifter 702 is processed by etching using the resist pattern 705 as a mask.

Next, as shown in (e) of FIG. 7A, the resist 705 is removed and a shifter pattern 706 is formed on the flat principal surface of the quartz glass substrate 701. At this time, the side at the end of the shifter pattern 706 is tapered. The cone angle $\theta$ is approximately 60 degrees. A chipped defect and a left defect in the phase shifter pattern 706 are inspected using an edge detection method. In this process, as the defect of the shifter can be inspected by the edge detection method because light shielding materials do not surround the shifter pattern 706, phase defect inspection simple and high in detection accuracy can be made.

Afterward, as shown in (f) of FIG. 7A, an EB resist 707 is applied and a desired light shielding pattern is written by EB (708). At the time of the exposure, the formation of a conductive film to prevent the increase of charges is also effective as in writing the shifter pattern 706. In this embodiment, the conductive film (not shown) the sheet resistance of which is 30 $M\Omega/cm^2$ is deposited on the resist 707. As no underlayer is required to be etched afterward, the resistance of the EB resist 707 to etching is not required to be minded and when resist materials excellent in covering difference in a level (or irregularities) at the edge of the shifter by the quantity and high in dimension accuracy on the surface having difference in a level are selected, the dimension accuracy of the mask can be enhanced. To acquire high dimension accuracy in a location having difference in a level, it is desirable that resist material that can be processed so that the sectional form is approximately perpendicular instead of the form of a skirt is used. Actually, in this embodiment, a resist having the perpendicular sectional form of approximately 90 degrees is used. As this EB resist also functions as light shielding materials from exposure light in printing, the materials are required to absorb exposure light strongly.

The EB resist 707 and the EB resist 703 used in the process shown in (b) of FIG. 7a for forming the phase shifter pattern may be also made of the same materials, however, as at least EB resist 707 is developed and used for the light shielding pattern in printing, the resistance to etching is not required to be minded as described above and the resist 707 is required to be made of materials that have a property that the end is easily processed so that the end is sharp and substantially perpendicular and can shield from exposure light in printing. That is, the EB resists 703 and 707 had better be made of different materials according to the used purpose.

Based upon the result of various experiments performed by these inventors, in this embodiment, photoresist materials mainly including novolac resin are used for the resist 707. It is found that as the novolac resin particularly strongly absorbs ArF exposure light having the wavelength of 193 nm as shown in FIG. 8 showing the result of measuring optical absorption characteristics to the wavelength of radiated light, the resin functions as sufficient light shielding material when printing is performed by exposure using an ArF excimer laser. Resin having a benzene ring such as phenol resin which is not limited to novolac resin is small in the degree of the absorption of KrF exposure light having the wavelength of 248 $\mu$m and others, however, the degree of absorption of ArF exposure light is remarkably large and therefore, the resin is favorable for ArF beam shielding material. The novolac resin and the phenol resin are organic materials themselves, dielectric materials and also, high resistance materials.

As the resist including a benzene ring has a property that the resist strongly absorbs light having the wavelength of 100 to 200 nm, 100 to 200 nm is favorable for the wavelength of exposure light in printing. The absorbency of a resist is expressed as an extinction coefficient (an imaginary part of a complex refractive index) and it is desirable from relationship described later between the thickness and an OD value that the absorbency is 0.5 or more, possibly 1.0 or more. In this embodiment, material the extinction coefficient of which is 1.0 is used. When the light shielding film is too thin, light shielding performance is not enough and when it is too thick, a problem that the transmissivity of an aperture varies depending upon the dimension of the aperture by the effect of the side wall of the resist pattern is caused. When the transmissivity of exposure light is lowered up to 3 or more in the terms of an OD value in a location in which the resist is thin in the vicinity of an edge having difference in a level, the resist functions as sufficient light shield material. When the OD value is 4 or more, the effect of the phase of light slightly transmitted in the light shielding part does not cause no problem and when the OD value is 5 or more, no light is transmitted. The OD value means a value expressed as log 10 (Iout/Iin) when incident light is Iin and transmitted light is Iout. It is desirable in view of critical dimension accuracy that the upper limit of the thickness d' at the edge of an aperture of the resist is the three times of the minimum aperture width w or less, that is, 3 w or less. When the wavelength of exposure light is $\lambda$ and the refractive index of exposure light in the phase shifter is n, the lower limit of the thickness is $\lambda/\{2(n-1)\}$. The thinner resist is not enough in the density of light shielding. It is desirable based upon the result of actual printing that 0.2 $\mu$m or more is practically secured.

As the edge of the shifter 706 is tapered as described above, the coverage of the resist is satisfactory and as the variation of the thickness is relatively small, resist pattern dimension accuracy is high. As the variation of the thickness of the resist has an effect in a large range though no pattern directly crosses a part having difference in a level, the effect of the tapered shape is large. In this case, the cone angle 0 is 60 degrees, space for registration is provided and the resist made of light shielding materials is limited so that the resist covers the taped part. The optimum cone angle is determined based upon a pattern smallest rule and the alignment accuracy of the shifter and the resist pattern. It can be verified based upon the result of various experiments that a cone angle of 45 degrees or more is desirable.

Afterward, as shown in (g) of FIG. 7B, development is performed and a light shielding resist pattern 709 is formed. Further, heating or the radiation of deep UV (DUV) or both processing is executed. Resistance to exposure light in the printing of the resist light shielding material 709 is enhanced by executing this processing.

A phase error of the phase shift mask equivalent to this embodiment is within 0.5 degree, the controllability of a phase is extremely high and as the phase shift mask has no dependency upon the dimension, the dimension accuracy and the resolution in pattern printing are high. The resist light shielding material 709 is in contact with the blanks 701 and the phase shifter 706 in large area and a defect such as the peeling of a pattern is not caused. Further, as the number of the manufacturing processes is small, the mask manufacturing yield is high and TAT is short. Further, the reflectivity of exposure light on the surface of the light shielding material 709 is 6% on the side of the air and is 1% on the side of the blanks, can be much smaller than the reflectivity of Cr on the surface of which Cr oxide described in relation to FIG. 16 is deposited and to which reflection prevention processing is applied and the deterioration of printing resolution performance due to a flare in a lens caused by the reflected light can be prevented. The reflectivity of Cr to which the reflection prevention processing is applied is 13% on the side of the air. The difference is increased in an inclined part caused because of difference in a level of the substrate.

In this embodiment, the phase 0 and the phase $\lambda$ the phases of which are inverse by 180 degrees are formed by processing the shifter 702 formed on the flat surface of the blanks 701, however, it is also effective to adjust phase difference by etching a part of the blanks in addition to this shifter pattern. At this time, when the wavelength of exposure light is $\lambda$, the refractive index of exposure light in the blanks is n0, the refractive index of exposure light in the shifter is n1 and the thickness of the shifter is d1, the phase is inverted by etching the blanks by the depth of "$\lambda/\{2(n0-1)\}-(n1-1)d1/(n0-1)$" and when printing is performed using the mask, the highest resolution is acquired. As in this method, the phase can be adjusted after the shifter is formed, it is effective to further enhance the mask manufacturing yield.

Second Embodiment

Referring to (a) to (e) of FIG. 9A and (f) and (g) of FIG. 9B showing the manufacturing process of a mask, a second embodiment of the invention will be described below.

First, as shown in (a) of FIG. 9A, an interference control layer 802 is formed on the flat principal surface of a quartz glass substrate (blanks) 801 and afterward, a shifter 803 is formed on the interference control layer 802. The interference control layer 802 is a transparent film that transmits exposure light and the refractive index n' of exposure light in the film is larger than that of the quartz glass substrate and is the same as or smaller than the refractive index n of the shifter 803. When the wavelength of exposure light is $\lambda$, it is desirable that the thickness d' of the interference control layer 802 meets an expression, $\sin(2\pi n'(d\alpha+/2(n-1)/\lambda)=\sin(2\pi n'd'/\lambda))$. On this condition, the multiple interference of exposure light caused between the blanks 801 and the shifter 803 is equal between the phase 0 and the phase $\pi$ and the dimension accuracy is enhanced. The interference control layer can be also made of the same material as the shifter 803, however, preferably the interference control layer having such etching selection ratio as the interference control layer functions as an etching stopper in processing the shifter 803 and having the substantially equal refractive index is optimum. Further, as the interference control layer is not influenced by the increase of charges in the following writing a resist by EB when the interference control layer is conductive, it is suitable. In this case, $TiO_x$ is used for the interference control layer 802 and $TiO_x$ is also used for the shifter 803, however, it is also effective to use different materials such as $SnO_x$ for the interference control layer 802 and $TiO_x$ for the shifter 803 and enhance processing accuracy.

The thickness d of the shifter 803 is set to $\lambda/\{2(n-1)\}$ when the wavelength of exposure light is $\lambda$ and the refractive index of exposure light in the shifter 803 is n. As a film made of $TiO_x$ and having a high refractive index is used for the shifter 803, the thickness d can be reduced and the afterward formation of a resist light shielding pattern is facilitated. To enhance the durability, after the interference control layer 802 and the shifter 803 are deposited, heating processing is applied, however, the thickness after the heating processing is set as the thickness d. In this case, for heating processing, baking at 200° C. for 30 minutes is performed, however, the invention is not limited to this. As the thickness of the shifter 803 is important to determine a phase angle, the thickness is measured after the layer is formed including heating processing and in case a value of the thickness of the shifter is not within reference values, the shifter is removed and is formed again. The allowable values of the dispersion of the thickness vary depending upon the dimension and required dimension accuracy, however, they are approximately 1%. As in the first embodiment, as the shifter 803 is deposited on the flat surface of a transparent plate, the thickness easily becomes uniform and as a problem that a phase angle (the thickness) varies every dimension by micro loading effect in etching does not occur, high resolution and dimension accuracy can be easily acquired. In this case, the shifter 803 is formed by sputtering, however, CVD and an application formation method can be also used.

Next, as shown in (b) of FIG. 9A, an EB resist 804 is formed on the shifter 803 by application and a desired shifter pattern is written by EB (805). In case the shifter 803 is not conductive, a water soluble conductive film is formed on the resist 804 and a countermeasure for the increase of charges in writing by EB is taken. When such a countermeasure is not taken, a written pattern is displaced because of the increase of charges. In this embodiment, as the conductive film is formed, no misregistration of a written position is caused due to the increase of charges.

Next, as shown in (c) of FIG. 9A, development is performed, a resist pattern 806 is formed and afterward, as in (d) of FIG. 9A, the shifter 803 is processed by etching using the resist pattern 806 as a mask. As described above, in case $SnO_x$ is used for the interference control layer 802 and $TiO_x$ is used for the shifter 803, it is found that the interference control layer 802 functions as an etching stopper by etching using CF gas for example, the shifter 803 can be processed precisely, the surface of the blanks 801 can be prevented from being etched and the surface of the blanks is not influenced by the distortion of processing and others.

Further, as shown in (e) of FIG. 9A, the resist 806 is removed and a shifter pattern 807 is formed on the interference control layer 802. A defect that the phase shifter chips and a defect that the phase shifter is left are inspected by an edge detection method. As light shielding material does not surround the shift pattern, the defect of the shifter can be inspected by the edge detection method and simple phase defect inspection having high detection accuracy can be executed.

Afterward, as shown in (f) of FIG. 9B, an EB resist 808 is applied and writing is performed by EB (809) using a desired light shielding pattern. It is also effective in exposure to form a conductive film for preventing the increase of charges as when the shifter pattern is written. In this embodiment, a conductive film (not shown) having the sheet resistance of 40 MΩ/cm² is deposited on the resist 808.

As afterward, the substrate is not required to be etched, the resistance to etching of the EB resist 808 is not required. When a resist excellent in the coverage of a part having difference in a level and having high dimension accuracy on the substrate having difference in a level by the quantity can be selected, the dimension accuracy of the mask can be enhanced. To acquire high dimension accuracy in a part having difference in a level, a resist the section of which is perpendicular and which is not in the shape of a skirt has only to be used. As the EB resist 808 also functions as exposure light shielding material in printing, it is required to be made of material that strongly absorbs exposure light in printing. In this embodiment, a resist (itself is dielectric material, high resistance material and also organic material) acquired by mixing dye of light having the wavelength of 248 nm with novolac resin is used. The resin functions as light shielding material enough for KrF exposure light having the wavelength of 248 nm in printing by the effect of the dye. Generally, when strong dye is added, the resolution performance of a resist is extremely deteriorated, however, this resist is an EB resist and as the added dye is for the wavelength of 248 nm, resolution enough to produce the mask can be acquired. It is desirable that the absorbancy of a resist is 0.5 or more, possibly 1.0 or more in the terms of an extinction coefficient in consideration of relation described later between the thickness and an OD value. In this embodiment, material the extinction coefficient of which is 0.6 is used. When the thickness is too thin, light shielding performance becomes insufficient and when the thickness is too thick, a problem that the transmissivity in an aperture varies depending upon the dimension of the aperture by the effect of a resist pattern side wall occurs. When the transmissivity of exposure light in a part having a thinner resist in the vicinity of the edge having difference in a level is lowered up to 3 or more in the terms of an OD value, the resist functions as sufficient light shielding material. When its OD value is 4 or more, the effect of the phase of light slightly transmitted in a light shielding part does not come into question and when its OD value is 5 or more, transmitted light has no effect. As the shifter 807 is made of $TiO_x$ the refractive index of which is high, there is little difference in a level by the shifter pattern and the coverage of the resist is enhanced, the resist to which dye is added can acquire sufficient resolution performance.

Afterward, as shown in (g) of FIG. 9B, development is performed and a light shielding resist pattern 810 is formed. Further, heating processing, DUV radiation or both processing is executed. The resistance to exposure light of the resist light shielding material 810 in printing is enhanced by executing this processing.

The phase error of the phase shift mask in this embodiment is within 0.5 degree, phase controllability is extremely high and as the phase shift mask has no dependency upon dimension, dimension accuracy and resolution when pattern printing is performed by KrF exposure light are high. The shifter having higher refractive index than that of blanks is used, however, there is no bad effect of multiple inference caused between the shifter and the blanks and there is no dimensional dispersion between the phase 0 and the phase π which are inverse by 180 degrees. The resist light shielding material 810 is in contact with the interference control layer 802 and the phase shifter 807 in large area and no defect such as the peeling of a pattern occurs. Particularly, adhesion between $TiO_x$ used for the interference control layer 802 and the phase shifter is satisfactory. Further, as the number of manufacturing processes of the phase shift mask is similarly small to that in the first embodiment, the manufacturing yield is also high and TAT is also short. Further, the reflectivity of exposure light on the surface of the light shielding material 810 is 6% on the side of the air, is 1% on the side of the blanks, can be much lower than the reflectivity (15% on the side of the air) of Cr on the surface of which Cr oxide is deposited and to which reflection prevention processing is applied and the deterioration of the resolution performance in printing due to a flare in a lens caused by the reflected light can be prevented. If the section of the edge of the shifter 706 is taped, the second embodiment is effective as in the first embodiment.

Third Embodiment

Referring to FIG. 10 showing the manufacturing process of a mask, a third embodiment of the invention will be described below.

First, as shown in (a) of FIG. 10, a photosensitive shifter 902 is formed on the flat principal surface of a quartz glass substrate (blanks) 901. For the material of the photosensitive shifter, organic SOG to which an acid generator is added is used. For the acid generator, triphenylsulfonium triflate (TPS) is used, however, the invention is not limited to this. The photosensitive shifter is also not limited to organic SOG and has only to be material that transmits exposure light, has resistance to exposure and has photosensitivity in writing a mask. As the refractive index of exposure light (wavelength: 193 nm) in the photosensitive shifter 902 is 1.58 and is close to 1.56 which is the refractive index of quartz glass, the photosensitive shifter 902 is directly formed on the flat principal surface of the blanks 901, however, when an interference control film is formed as in the second embodiment in case there is difference between both refractive indexes, multiple interference caused in the shifter can be reduced and the interference control layer is effective to enhance dimension accuracy. When a conductive film is formed on the blanks 901, there is effect that the increase of charges is prevented as in the second embodiment when the photosensitive shifter is next written. In this case, the photosensitive shifter 902 is formed by application, however, another method such as CVD may be also used. However, an application formation method has characteristics that it is simple and a defect is hardly caused. For another applied film, an acid generator is added to methyl silazane. After the shifter is applied, heating processing at 120 is executed. The inspection of a defect is performed after the shifter is formed and it is verified that there are no pin hole defect and no foreign matter defect. In case these defects are found, the shifter is removed and a new shifter is formed again.

The thickness d of the shifter 902 is set to a value corrected so that $\lambda/\{2(n-1)\}$ after densifying baking described later. The wavelength of exposure light is $\lambda$ and the refractive index of exposure light in the shifter 902 after the densifying baking is n.

Next, as shown in (b) of FIG. 10, the photosensitive shifter 902 is directly written by EB with a predetermined pattern (903). A water soluble conductive film (not shown) is formed on the photosensitive shifter 902 for a countermeasure for the increase of charges in writing by EB. If such a countermeasure is not taken, the misregistration of a written pattern is caused by the increase of charges. In this embodiment, as the conductive film is formed, no misregistration of a written pattern is caused by the increase of charges.

Next, as shown in (c) of FIG. 10, development is performed and a shifter pattern 903 is formed. Afterward, to enhance resistance to exposure light and prevent weathering, heating processing is applied to the shifter pattern 904. In this case, for heating processing, baking at 250° C. for 30 minutes is performed, however, the invention is not limited to this. As the temperature is raised, the resistance is enhanced. As the thickness d of the shifter 904 determines a phase angle and is important, the thickness is measured after the heating processing and if the thickness is not within reference values, the shifter is removed and a new shifter is formed again. The allowable values of the dispersion of the thickness vary depending upon the dimension and required dimension accuracy, however, the allowable value is approximately 1%. As the shifter is deposited on the flat surface, the thickness easily becomes uniform and as no problem that a phase angle (the thickness) varies every dimension by micro loading effect in etching occurs, high resolution and high dimension accuracy can be easily acquired.

Afterward, a defect that the phase shifter chips and a defect that the phase shifter is left are inspected by an edge detection method. As the light shielding material does not surround the shifter pattern, the defect of the shifter can be inspected by the edge detection method and simple phase defect inspection having high detection accuracy can be performed. As described above, a phase shifter pattern free of a defect and excellent in phase controllability can be formed in only processes for application, baking, exposure and development without an etching process.

Afterward, as shown in (d) of FIG. 10, a resist 905 is applied and is written by EB (906) with a desired light shielding pattern. It is also effective to form a conductive film for preventing the increase of charges in exposure as when the shifter pattern 904 is written. In this embodiment, a conductive film (not shown) having the sheet resistance of 40 M$\Omega$/cm$^2$ is deposited on the resist 905. As afterward, the substrate is not required to be etched, the strictness of the resistance to etching of the EB resist 905 is not required and when resist material excellent in the coverage of a part having difference in a level and having high dimension accuracy on the substrate having difference in a level by the quantity is selected, the dimension accuracy of the mask can be enhanced.

As the EB resist 905 also functions as exposure light shielding material in printing, it is required to be made of material that strongly absorbs exposure light in printing. In this embodiment, a photoresist mainly made of phenol resin is used, however, the extinction coefficient to exposure light (wavelength: 193 nm) of the material is 0.9 and the material functions as sufficient light shielding material in printing using ArF exposure light. It is desirable that the absorbency of the resist is 0.5 or more, possibly 1.0 or more in terms of an extinction coefficient in consideration of relation between the thickness and an OD value described later. When the thickness is too thin, light shielding performance becomes insufficient and when the thickness is too thick, a problem that the transmissivity of an aperture varies depending upon the dimension of the aperture by the effect (waveguide effect) of the resist pattern side wall occurs. When the transmissivity of exposure light is lowered up to 3 or more in the terms of an OD value in a location in which the resist is thin in the vicinity of an edge having difference in a level, the resist functions as sufficient light shield material. When the OD value is 4 or more, the effect of the phase of light slightly transmitted in the light shielding part causes no problem and when the OD value is 5 or more, transmitted light has no effect.

In this embodiment, the EB resist is used, however, a resist for exposure such as KrF and i may be also used and a laser and others can be also used for writing. For writing by a laser, resolution is slightly inferior to that in writing by EB, however, writing by a laser has characteristics that a problem of the increase of charges is solved and the effect of heat in exposure is reduced.

Afterward, as shown in (e) of FIG. 10, development is performed and a light shielding photoresist pattern 907 is formed. Further, heating or the radiation of deep UV (DUV) or both processing is executed. Resistance to exposure light in the printing of the resist light shielding material 907 is enhanced by executing this processing.

A phase error of the phase shift mask equivalent to this embodiment is within 0.5 degree, the controllability of a phase is extremely high and as the phase shift mask has no dependency upon the dimension, the dimension accuracy and the resolution in pattern printing by ArF exposure light are high.

The resist light shielding material 907 is in contact with the phase shifter 904 and the substrate 901 in large area and a defect such as the peeling of a pattern is not caused. As the number of the manufacturing processes of the mask is much smaller, compared with that in the embodiment and in addition, the manufacturing process includes only processes for application, baking, exposure, development and inspection respectively hardly causing a defect, the mask manufacturing yield is high and TAT is short.

Further, the reflectivity of exposure light on the surface of the light shielding material is 6% on the side of the air and is 1% on the side of the blanks, can be much smaller than the reflectivity (18% on the side of the air) of Cr on the surface of which Cr oxide is deposited and to which reflection prevention processing is applied and the deterioration of printing resolution performance due to a flare in a lens caused by the reflected light can be prevented. The difference is increased in an inclined part caused because of difference in a level of the substrate.

Fourth Embodiment

Referring to (a) to (e) of FIG. 11A and (f) to (j) of FIG. 11B respectively showing the manufacturing process of a mask, a fourth embodiment of the invention will be described below.

First, as shown in (a) of FIG. 11A, a resist 1002 is applied on blanks 1001 by a normal method, a desired shifter pattern is written by EB (1003), is developed and as shown in (b) of FIG. 11A, a resist pattern 1004 is formed.

Afterward, as shown in (c) of FIG. 11A, the exposed surface of the transparent plate (the blanks) 1001 is partially etched in predetermined depth and a concavity, that is, a groove or a depression is formed.

Next, as shown in (d) of FIG. 11A, the resist 1004 is removed by a normal method and difference in a level composed by a concavity and/or a convexity is made on the principal surface of the blanks 1001. The difference in a level, that is, the difference in a level between a convexity 1005 and a concavity 1006 in (d) of FIG. 11A is measured with a meter for measuring difference in a level or an atomic force microscope (AFM) and is converted to phase difference or phase difference is directly measured by an interferometer. In case phase difference between wavelengths of exposure light is in a desired range of 180 degrees, processing proceeds to a process shown in (i) of FIG. 11B. In this case, the range is ±1.5 degrees. The value varies depending upon required dimension accuracy and as high dimension accuracy is required, the range becomes narrow. When phase difference is outside the desired range, processing proceeds to the following process.

In this embodiment, as phase difference is 165 degrees, the resist 1007 is applied again as shown in (e) of FIG. 11A, a shifter pattern is exposed (1008), is developed and as shown in (f) of FIG. 11B, a resist pattern 1009 is formed.

Afterward, as shown in (g) of FIG. 11B, the blanks 1001 is etched again. Next, the resist 1009 is removed and as shown in (h) of FIG. 11B, blanks having phase shift patterns 1010 and 1011 is formed.

Phase difference to exposure light between two surfaces 1010 and 1011 shown in (h) of FIG. 11B is measured and it is varied that the phase difference is in a desired range of 180 degrees. Afterward, phase defect inspection is performed in an edge detection mode. As no defect is detected, processing proceeds to the next process, however, in case a defect is detected, it is corrected using FIB method or when the correction of the defect is difficult, the two surfaces are produced again. This method has a characteristic that in a relatively initial process, phase defect inspection can be performed by a method having high inspection accuracy called the edge detection method. Afterward, cleaning processing is performed.

Next, as shown in (i) of FIG. 11B, an EB resist 1012 is applied and the exposure of a pattern for forming a part for light to be shielded is performed (1013). Afterward, development is performed and as shown in (j) of FIG. 11B, a light shielding pattern 1014 made of the resist is formed.

As in the first to third embodiments, a water soluble conductive film is formed on the EB resist for a countermeasure for preventing the increase of charges in writing by EB. For a measure for preventing the increase of charges, a method of forming a conductive film such as ITO under a resist is also effective in addition. As the effect of the increase of charges can be also avoided in measuring the dimension using SEM and others in case the conductive film is left, high precision QC can be performed.

As the resist 1014 also functions as light shielding material from exposure light in printing, it is required to be made of material that strongly absorbs exposure light in printing. In this embodiment, a photoresist mainly made of novolac resin is used. As novolac resin strongly absorbs ArF exposure light having the wavelength of 193 nm, it functions as sufficient light shielding material in printing by ArF exposure light. For other materials, there are polyaniline resin and others. As polyaniline resin has conductivity, charges hardly increase in writing by EB and it is also effective in the sense. In case polyaniline resin is used, the application of a water soluble conductive film can be omitted.

In this embodiment, as a process for depositing Cr and a process for etching Cr are not included, the number of the manufacturing processes of the mask can be reduced and as the high quality deposition of Cr is not required, the manufacturing cost can be reduced by the quantity. Further, the reflectivity of exposure light on the surface of light shielding material is 6% on the side of the air, is 1% on the side of the blanks, is much smaller than the reflectivity of Cr on the surface of which Cr oxide is deposited and to which reflection prevention processing is applied and the deterioration of printing resolution performance due to a flare in a lens caused by the reflected light can be prevented.

In this embodiment, the phase difference of 180 degrees is given between a phase 0 and a phase π by etching only the side of the phase π of the blanks, however, the phase difference of 180 degrees may be also given between both phases according to a method of also etching the phase 0 in addition to the phase π.

Fifth Embodiment

In the first to fourth embodiments, the shifter and irregularities on the blanks are required to be accurately positioned based upon the position of these shifter patterns and a light shielding pattern is required to be written. However, as the material of the shifter pattern is close to that of the blanks or the same, positioning accuracy is deteriorated when the shifter pattern, particularly a part having difference in a level of it (a boundary and irregularities) is positioned. Then, a third layer is formed by a metallic film, an alignment mark is formed on it beforehand, the mark is detected, and the shifter pattern and the resist light shielding pattern are written. Based upon the third embodiment, referring to process drawings shown in FIG. 12, a fifth embodiment will be described below.

First, as shown in (a) of FIG. 12, a metal layer 1102 on which an alignment reference mark 1103 in writing by EB is formed is formed on the flat surface of blanks 1101. The metal layer is formed outside a pattern printed field. A dielectric film, a high resistance film or an organic film (for example, a photoresist) is arranged in the center of the blanks and the metal layer is arranged outside it. For metal, Cr is used, however, in addition, W, Ti, Mo, MoSi, Ta or WNx can be also used. Material the processing of which is easy and in which high contrast of the reflection of EB is acquired is desirable.

Next, as shown in (b) of FIG. 12, a photosensitive shifter 1104 and a water soluble conductive film 1105 are formed on the photoresist and the metal layer, the shifter pattern is exposed by EB and is developed and as shown in (c) of FIG. 12, a shifter pattern 1106 is formed. When the shifter pattern 1106 is exposed, the reference mark 1103 is detected by EB and referring to the position, writing is performed. As the alignment mark is made of a metal pattern, it can be precisely detected.

Afterward, as shown in (d) of FIG. 12, an EB resist 1107 is applied and a water soluble conductive film 1108 is formed on it.

Afterward, a light shielding pattern is exposed by EB and as shown in (e) of FIG. 12, a resist pattern 1109 is formed. When the light shielding pattern is exposed by EB, the reference mark 1103 is detected by EB and referring to the position, writing is performed by EB. As the reference mark is made of a metal pattern, it can be precisely detected. The shifter pattern 1106 and the resist light shielding pattern 1109 are relatively aligned using the metal mark 1103. Though three layers are aligned, the alignment accuracy of 50 nm is acquired because alignment reference mark detection contrast is high. In the meantime, when the resist light shielding pattern is written using the shifter pattern as an alignment reference mark, sufficient contrast is not acquired in detecting the mark, alignment accuracy is 200 nm, further, the mark is detected by mistake and writing may be disabled.

In this process, the case in the third embodiment is described, however, in the other embodiments, writing is similarly performed using the metal reference mark. As a result, sufficient alignment accuracy can be acquired. In case the shifter has sufficient conductivity, required alignment accuracy can be also acquired using a shifter pattern mark instead of the metal reference mark.

(a) in FIG. 13 shows the outline when a manufactured mask is viewed from the top. An outer frame 1101 made of metal is formed outside a pattern printed field region 1110 and in the outer frame region, a shifter pattern and resist light shielding pattern alignment reference mark 1111 and a reticle mark 1103 for making lithography equipment recognize a position in which a mask is located and for alignment are formed. Further, an identification mark 1112 for identifying the reticle (the mask) is formed on the metal layer on the outer frame.

When the reticle mark 1103 is made of metal, it can be precisely detected even if the position is monitored with light of any wavelength. The reticle mark 1103 is formed by removing a part of the metallic film of the light shielding outer frame 1101 and exposing a transparent mask substrate under the metallic film. Therefore, as the contrast of light transmitted in the reticle mark 1103 is sufficiently acquired even if lithography equipment using a normal halogen lamp and others for detecting the position of a mask is used, reticle mark recognition capacity can be enhanced. Therefore, a mask and lithography equipment can be relatively aligned easily and precisely. According to the result of review by these inventors, alignment is enabled at the similar accuracy to a normal photomask.

Referring to the configuration of lithography equipment, this will be described below. FIG. 17 shows an example of reduction projection lithography equipment used in the various embodiments and exposure light emitted from a light source 1501 of the reduction projection lithography equipment radiates a mask 1507 via a fly eye lens 1502, an aperture for the selection of an illuminator condition 1503, condenser lenses 1504 and 1505 and a mirror 1506. The mask 1507 is mounted in a state in which the principal surface on which a light shielding pattern is formed (the first principal surface) is directed downward(on the side of a semiconductor wafer 1509). Therefore, exposure light is radiated from the side of the rear surface (the second principal surface) of the mask 1507.

Hereby, a mask pattern written on the mask 1507 is projected on the semiconductor wafer 1509 which is a sample substrate via a projection lens 1508. A pellicle 1510 for preventing pattern printing failure by the adhesion of a foreign matter is provided on the first principal surface of the mask 1507 if necessary.

The mask 1507 is vacuum-attracted on a mask stage 1512 controlled by mask position control means 1511, is aligned by position detection means 1513, and the center and the optical axis of the projection lens are precisely aligned. The semiconductor wafer 1509 is vacuum-attracted on a sample stage 1514. The sample stage 1514 is mounted on Z stage 1515 which can be moved in a direction of the optical axis of the projection lens 1508, that is, in a direction of the z-axis and further, is mounted on an XY stage 1516. As the Z stage 1515 and the XY stage 1516 are driven by respective driving means 1518 and 1519 according to a control instruction from a main control system 1517, they can be moved in a desired exposure position. The position is precisely monitored as the position of the mirror 1520 fixed on the Z stage 1515 by a laser length measuring machine 1521.

Further, for example, a halogen lamp is used for the position detection means 1513. That is, a special light source is not required to be used for the position detection means 1513 (new technique and difficult technique are not required to be newly adopted) and normal reduction projection lithography equipment can be used.

In the meantime, when a reticle mark is made of resist light shielding material, alignment using the reticle mark is difficult. This reason is that generally, light having a longer wavelength than exposure light cannot be shielded with sufficient contrast.

A film in a part which comes in contact with the stage of the lithography equipment and a carrier is removed halfway a manufacturing process without leaving a light shielding film such as a resist, a photosensitive shifter or an applied shifter. When a film is required to be left, the surface may be also covered with a metallic film such as Cr so that the surface is not exposed. Hereby, a foreign matter can be prevented from being caused by carriage. In case such a measure is not taken, a foreign matter is caused and a defect in printing may be caused.

(b) in FIG. 13 shows another example when a mask is viewed from the top. Outside a pattern printing field region 1202, a shifter pattern and resist light shielding pattern alignment reference mark 1201 and an identification mark region 1203 for identifying a reticle (a mask) are formed. The alignment reference mark 1201 and the identification mark region 1203 are made of metal. It is desirable that the alignment reference mark is arranged at least at four corners of a mask to correct distortion in writing.

That is, writing is performed monitoring mark at four corners and correcting distortion. A mask identification mark 1204 is written on the metal region 1203 with a resist. As a resist is a thin film on the metal though a resist mark on the blanks is difficult to be identified with naked eyes, interference occurs in the resist, reflectivity varies and identification is enabled. However, the identification mark is required to be formed in a location which is not in contact with the stage of the lithography equipment and a carriage mechanism. The reason is that as the mark is made of an organic fragile film, a foreign matter is caused when the mark is touched and when a mask according to the invention is treated, care is required.

The case that the identification mark is formed on the metal by a resist is described above, however, referring to FIG. 14, a method of directly providing an identification mark on the blanks (the quartz glass) will be described below.

(a) of FIG. 14 shows a mask identification mark by a character 2201 RET written with a photoresist on the metal region 1203 shown in FIG. 13, (b) of FIG. 14 shows a mask identification mark written not by a character but by a so-called bar code 2203 and in both cases, plural photoresists in the shape of a slit are arranged in parallel at an interval of 0.5 to 2.0 μm (2202, 2204) or multiple slits are carved on one photoresist at the pitch. Actually, photoresists are written at the pitch of 1.0 μm, however, reflectivity increases by interference effect and they can be sufficiently identified. Particularly, as the setting of a code can be arbitrarily determined in display shown in FIG. 14, the identification mark can be utilized for extremely detailed management information related to manufacture and is also effective for security for preventing the leakage of manufacturing various information.

Sixth Embodiment

In a sixth embodiment, an example that a transparent pellicle is arranged on the principal surface of a mask so that a foreign matter does not adhere to the pattern formation surface (the first principal surface) of the mask will be described. The sixth embodiment is similar to the first to fifth embodiments except it. A case that a mask in which a light shielding pattern made of a metallic film is provided in the periphery of a mask substrate as the mask described in the fifth embodiment is used will be described below.

FIG. 15 shows a concrete example of a mask in the sixth embodiment. (a) of FIG. 15 is a plan showing a mask 1301, (b) of FIG. 15 is a sectional view showing the main part and a state when the mask 1301 is mounted in predetermined equipment, and (c) of FIG. 15 is a sectional view showing the main and an applied example.

In the sixth embodiment, a pellicle 1302 is bonded to the principal surface (the first principal surface) of the mask 1301 via a pellicle sticking frame 1303 and is fixed. The pellicle 1302 is a transparent protective film provided from the principal surface of the mask substrate or the principal surface and the rear surface to fixed distance to prevent a foreign matter from adhering to the pattern formation principal surface of the mask 1301. The fixed distance is designed in consideration of a foreign matter which adheres to the surface of the protective film and the printing of a foreign matter on the surface of a processed material body such as a semiconductor wafer.

The pellicle 1302 is arranged a pellicle cover region of the mask 1301. That is, the pellicle 1302 is arranged so that it covers the whole integrated circuit pattern formation region 1304 of the mask 1301 and a part of a metal light shielding pattern 1305 formed in the peripheral inside region.

In this embodiment, the base of the pellicle sticking frame 1303 is bonded and fixed in a state in which the base is directly in contact with the metal light shielding pattern 1305 in the peripheral inside region of the mask 1301. Hereby, the pellicle sticking frame 1303 can be prevented from being peeled. In the meantime, when a resist is formed in a position in which the pellicle sticking frame 1303 is attached, the resist is peeled and a foreign matter is caused in attaching or detaching the pellicle 1302. In this embodiment, as the pellicle sticking frame 1303 is bonded in a state in which it is directly touched to the light shielding pattern 1305, such a foreign matter can be prevented from being caused. Such effect is also acquired in case the pellicle sticking frame 1303 is bonded and fixed in a state in which it is directly touched to the mask substrate 1301.

As in the fifth embodiment, as shown in (b) of FIG. 15, no organic film such a resist exists in a part in which the mask 1301 and a vacuum suction stage 1306 of the projection lithography equipment are touched. In (b) of FIG. 15, the metal film 1305 exists. Hereby, as in the fifth embodiment, a foreign matter can be prevented from being caused due to the peeling and a chip of a resist.

In this embodiment, a mark pattern 1307 for calibrating a position is formed in the metal light shielding pattern 1305. The mark pattern 1307 for calibrating a position is a pattern for directly detecting the positional information of a mask from the mask itself when a predetermined pattern is written on the mask using an electron beam writer. That is, in this embodiment, a pattern is written, correcting (adjusting) a position in which an electron beam for writing a pattern in a pattern writing process is radiated by reading the mark pattern 1307 on the mask substrate once every seconds when a predetermined integrated circuit pattern is formed in an integrated circuit pattern formation region of the mask substrate using an electron beam writer. Hereby, pattern writing position accuracy by the electron beam writer can be further enhanced. The reason why such a mark pattern 1307 is provided is as follows.

In a normal electron beam writer, processing for writing on a mask is executed in decompressed vacuum. For holding a mask in vacuum, a mask substrate or a cassette including a mask substrate is pressed on a three-point pin of a mask holder on the moving stage of the electron beam writer and is mechanically fixed by a pin. In a normal electron beam writer, to prevent misregistration by the drift of the position of an electron beam during writing in pattern writing, a mark pattern for detecting a position attached to the mask holder is detected plural times in writing.

As a mask substrate on the mask holder (stage) is mechanically fixed as described above, relative positional relation between the mark pattern on the mask holder and the mask substrate should be fixed, however, actually, slight misregistration may occur between the mark pattern and the mask substrate by the shock of the stage moved at high speed. Therefore, though the position of the mask substrate is read from the mark pattern in the electron beam writing process, misregistration occurs in a written pattern.

Then, in this embodiment, the mark pattern 1307 for calibrating a position is arranged on a mask (a mask substrate) itself and the position can be directly detected from the mask substrate itself. Hereby, as the misregistration of the mask substrate can be corrected, a pattern arrangement error can be reduced. Such a mark pattern 1307 is in a light transmitted region or in a light shielded region and information is detected by a position detection beam radiated there or based upon the reflection of detected light. For position detection means, a type using an electron beam from an electron beam writer, a type using a laser beam from a laser writer or other type can be used. Particularly, the application of equipment the positional accuracy of which is high is desirable. A reference number 1308 in FIG. 15 denotes a circuit pattern and 1309 denotes a reticle mark showing the position of a mask in lithography equipment.

As shown in (c) of FIG. 15, an identification mark RETICLE-A of a built mask is written on the side wall of the frame 1303 of the pellicle 1302 attached to the metallic film 1305 on the mask substrate 1301 via an adhesive and others. Hereby, the area of the surface of the pellicle can be effectively utilized for various inspection, measurement and observation. In this example, as described above, the pellicle is also attached on the surface of the mask substrate on which no photoresist is provided.

According to the sixth embodiment, in addition to the effect acquired in the embodiments, the following effect can be acquired. (1) A foreign matter is prevented from adhering to a mask by providing a pellicle to the mask and the deterioration of a printed pattern caused by the adhesion of the foreign matter can be inhibited or prevented. (2) A resist for forming a light shielding pattern can be prevented from being peeled or being chipped when the pellicle is attached or detached by bonding the pellicle sticking frame to the light shielding pattern or the mask substrate in a state in which the pellicle sticking frame is directly touched. Therefore, a foreign matter can be prevented from being caused due to the peeling and a chip of the resist. (3) The pattern written position accuracy of the electron beam writer can be enhanced by providing a mark pattern for correcting a position written by an electron beam from the electron beam writer on a mask itself.

Seventh Embodiment

Referring to FIG. 18 which is a plan showing a mask pattern, a seventh embodiment will be described below.

A reference number 1601 in FIG. 18 denotes a resist light shielding surface, 1602 denotes an aperture of a phase 0 and 1603 and 1604 denote an aperture of a phase $\pi$. The reference numbers 1602 and 1603 denote a body pattern having a dimension in which pattern printing is enabled and 1604 denotes a so-called assist pattern the image of which is directly not printed for enhancing the resolution performance of a pattern in the vicinity. The minimum dimension of the body patterns 1603 and 1604 is 0.2 $\mu$m (a dimension on a wafer, as the reduction percentage of a lens is 4×, the dimension on a mask is 0.8 $\mu$m) or less and though not shown, patterns of each dimension from 0.1 $\mu$m to 0.2 $\mu$m are provided on a wafer. The width of the assist pattern 1604 is 0.04 $\mu$m on a wafer (0.32 $\mu$m on a mask).

The mask is produced according to the first embodiment, however, it may be also produced according to the other embodiments except the problem of selecting the material of the resist light shielding material. This mask is installed in an ArF excimer laser scanner the numerical aperture NA of a lens of which is 0.6 and is printed on an ArF negative resist.

As a result, the resist light shielding material 1601 shows sufficient light shielding effect and no resist is left in the field region. The body patterns 1602 and 1603 can be formed at the high dimension accuracy of 5% by Levenson phase shift. The resolution of the body pattern between the assist patterns is higher than that in case a conventional type phase shift mask using Cr is used. The reason is that as light shielding material is high resistance material or dielectric material of a resist, guide wave effect (that is, waveguide effect) is small and further, material hardly causing reflection is used. No 0/$\pi$ difference phenomenon also occurs in a Levenson phase shift part and high dimension accuracy is also acquired in that sense. However, this effect becomes remarkable when the width of a pattern is 0.16 $\mu$m or less and pattern pitch is 0.32 $\mu$m or less in printing and the effect is the same in a larger dimension as the case that the phase shift mask by the conventional method is used. According to the review of the result acquired by varying the numerical aperture NA of a lens, when pattern pitch is $\lambda$/NA or less, dimension accuracy is particularly high, compared with a conventional method.

Eighth Embodiment

A semiconductor integrated circuit is produced using the mask and the pattern forming method according to the invention. (a) of FIG. 19 is a plan showing a representative pattern layout.

A reference number 1701 in (a) of FIG. 19 denotes a semiconductor region such as an impurities diffused layer, 1702 denotes a contact with the semiconductor region, 1703, 1704, 1706 and 1707 denote gate wiring and 1705 denotes a via hole of a wiring layer. To accelerate the operational speed of a circuit and enhance packing density, it is required that the dimension of active gate wiring formed on the semiconductor region such as the diffused layer is thin, the dimension accuracy is high and a gate wiring interval 1708 that determines pitch between gate wiring is narrow.

(b) of FIG. 19 is a plan showing a phase shift mask used for forming the gate wiring shown in (a) of FIG. 19. In this case, the mask produced according to the first embodiment is used. However, the mask produced according to other embodiments, for example, the mask formed according to the third embodiment can be also used. A reference number 1709 shown in (b) of FIG. 19 denotes resist light shielding material and a shifter (a phase $\pi$) is alternately arranged in an aperture so that Levenson arrangement is acquired. When a pattern is printed using this mask and an ArF scanner the numerical aperture NA of which is 0.6, the pattern interval 1708 of 0.1 $\mu$m extremely narrow is acquired, in addition, the dimension in the phase $\pi$ shown as 1704 and 1706 and the dimension in the phase 0 shown as 1703 and 1707 are coincident and a so-called pattern printing without 0/$\pi$ difference can be realized.

Further, dimension difference between a location in which pattern edges are relatively densely arranged such as 1703 and 1707 and a location in which pattern edge are thinly arranged such as 1706 and 1707 is small and is in a range of correction based upon the characteristics of a lens. These owe to the reduction of waveguide effect and the reduction of reflection on the surface because light shielding material is high resistance material and dielectric material.

It can be verified that in case a phase shift mask having Cr light shielding material is used, dimension accuracy is lower by approximately 20%, compared with the case that the mask in this embodiment is used. According to this gate pattern formation method, a semiconductor integrated circuit the operating frequency of which is high, the packing density of which is high and the chip of which is small can be produced. As not only the number of chips acquired every wafer is increased but the manufacturing yield of the chip is enhanced when the chip becomes small, the manufacturing cost can be greatly reduced.

Ninth Embodiment

A minute gate pattern is formed using a shifter edge phase mask in this embodiment. (a) of FIG. 20 shows the phase mask used at that time, (b) of FIG. 20 shows a binary mask, and (c) of FIG. 20 shows a resist pattern formed by printing.

A reference number 1801 in FIG. 20 denotes the contour of a pattern to be formed, 1802 denotes a resist light shielding pattern the width of which is narrow for forming gate thin wiring, 1803 denotes resist light shielding material, 1804 denotes an aperture for a phase 0, 1805 denotes an aperture in which a shifter of a phase $\pi$ is formed, 1806 denotes transparent glass, 1807 denotes a light shielding pattern and 1808 and 1809 denote a gate pattern formed by printing. For the mask shown in (b) of FIG. 20, a Cr binary mask in which the gate pattern 1808 is made of Cr can be also used, however, in this case, a resist mask light shielding binary mask in which the gate pattern 1807 is made of resist light shielding material is used.

After a first mask shown in (a) of FIG. 20 is installed in lithography equipment and a positive resist is exposed, a second mask shown in (b) of FIG. 20 is installed in the lithography equipment, the resist is exposed, normal heating processing and development are applied to the resist and a resist pattern is formed.

In this embodiment, extremely thin gate wiring 1808 the width of which is 60 nm can be acquired using an ArF scanner NA of which is 0.63 reproducibly. In a normal shifter edge phase shift mask, as the problem of mechanical strength occurs in thin light shielding material 1802, the yield of a non-defective mask is low, however, in a mask in this embodiment, such a problem does not occur and the yield of a non-defective mask is high.

Further, in blanks carved type shifter edge phase shift mask made of Cr, as described above, when blanks of a shifter 1802 are carved, side etching is performed to prevent resolution performance from being deteriorated due to reflection on the side wall, however, as thin light shielding material 1802 is thin, the quantity of side etching cannot be sufficiently secured, it has an effect upon printing performance and dispersion in the dimension among printed resist patterns is approximately 10%, while in this embodiment, dispersion in the dimension among printed resist patterns is 5% and can be reduced.

Tenth Embodiment

An electronic circuit composed of plural semiconductor memory elements is produced on one semiconductor wafer using the mask and the pattern forming method according to the invention. (a) to (d) of FIG. 21 are sectional views showing main processes for manufacturing the memory element.

As shown in (a) of FIG. 21, a P-type Si semiconductor 71 is used for a substrate and an element isolation region 72 made of $SiO_2$ is formed on it using element isolation technique. Next, a word line (a gate electrode) 73 made of polycrystalline Si and having the thickness of 150 nm for example is formed on the surface of the semiconductor where no element isolation region 72 is provided via a gate insulating film made of $SiO_2$ and others and having the thickness of 200 nm or less, further, an $SiO_2$ film having the thickness of 150 nm for example is deposited on it using chemical vapor deposition and a side spacer 74 made of $SiO_2$ is formed on the side wall of the word line 73 by anisotropically processing. Next, an N-type diffused layer (a source or drain region) 75 is formed by a normal method.

Next, as shown in (b) of FIG. 21, a data line 76 made of polycrystalline Si or high-melting point metal silicide or a laminated film of these is formed via a normal process and the upside is covered with an insulating film made of $SiO_2$ and others. Next, as shown in (c) of FIG. 21, a capacitor electrode (a storage electrode) 78 made of polycrystalline Si, connected to the semiconductor region and extended on the insulating film is formed via a normal process. Afterward, $Ta_2O_5$, $Si_3N_4$, $SiO_2$, BST, PZT, ferroelectric material or a composite film of these is deposited and an insulating film 79 for a capacitor is formed. Next, a conductor having low resistance such as polycrystalline Si, high-melting point metal, high-melting point metal silicide, Al and Cu is deposited and a plate electrode 80 is formed.

Next, as shown in (d) of FIG. 21, wiring 81 is formed via a normal process. Next, an electronic circuit composed of plural memory elements is produced via a normal wiring forming process and a passivation process.

Only representative manufacturing processes are described above, however, normal manufacturing processes are used except the above processes. Even if the order of the processes is different, the invention can be applied. The invention can be also applied to a lithography process in the above element manufacturing process. For example, the invention is not necessarily required to be applied to a process in which a minute pattern is not required to be formed or a process in which high dimension accuracy is not required. The invention is not applied to a through hole forming process in the passivation process and a pattern forming process for forming an ion implantation mask the pattern of which is large. Processes in which the pattern forming process according to the invention is particularly effective are the element isolation region forming process, the word line forming process, the capacitor electrode forming process and the wiring forming process.

Next, a pattern formed by lithography will be described. (a) of FIG. 22 shows a pattern layout of a memory of a representative pattern including memory elements. A reference number 82 denotes a word line, 83 denotes a data line, 84 denotes an active region, 85 denotes a capacitor electrode and 86 denotes the pattern of an electrode hole. (b) of FIG. 22 shows a pattern layout of a memory of a representative pattern including another memory elements. A reference number 87 denotes a word line, 88 denotes a data line, 89 denotes an active region, 90 denotes a storage electrode and 91 denotes the pattern of an electrode hole. The invention is applied to the formation of a pattern of the word line and the data line. In (b) of FIG. 22, the invention is also applied to the formation of a pattern of the storage electrode. The invention is applied to a process using a minimum design rule except the above formation of patterns.

The characteristics of the element produced according to the invention are satisfactory, compared with the characteristics of an element produced using a conventional method. Concretely, the improvement of the characteristics that as the dispersion in the width of the word line is small, data reading speed is fast, the characteristics are stable and as the dispersion in the area of the storage electrode is small, a data storage characteristic is stable can be realized. Also, the yield of acquiring non-defective products of the produced element is improved.

Eleventh Embodiment

Next, referring to FIG. 23 showing a section of the main part every process, an example in which the invention is applied to the manufacture of an integrated circuit provided with a complementary MIS (CMIS) circuit according to a so-called twin well method will be described.

As shown in (a) of FIG. 23, an N-type well 102 and a P-type well 103 are formed on the upper surface of an N-type Si semiconductor substrate 101 that forms the principal part of a semiconductor wafer, a field insulating film 105 for isolating elements made of $SiO_2$ is formed using selective oxidizing technique across both wells, and P-channel MISFET (Qp) and N-channel MISFET (Qn) are formed in a semiconductor active region of each well surrounded by the insulating film 105. Reference numbers 111 and 112 are a P-type semiconductor region that forms source and drain regions, 113 and 114 are an N-type semiconductor region that forms source and drain regions, 106 and 107 are a gate insulating film made of $SiO_2$ and others, and 115 and 116 are a gate electrode provided on the gate insulating film. These gate electrodes 115 and 116 are formed by reduction projection lithography equipment using a KrF excimer laser, photolithography using the photomask produced in the various embodiments of the invention and normal etching technique after a low-resistance polysilicon film for example is deposited by CVD. The gate electrode is approximately 0.2 $\mu$m long. The semiconductor regions 111 to 114 are self-aligned with respective gate electrodes.

Next, as shown in (b) of FIG. 23B, after an interlayer insulating film 118 made of $SiO_2$ is deposited by CVD and others, a polysilicon film is deposited on it, is patterned by the reduction projection lithography equipment using the KrF excimer laser, photolithography using the photomask produced in the various embodiments of the invention and normal etching technique, and wiring 119 and a resistor 120 are formed by partially doping impurities.

Next, as shown in (c) of FIG. 23, after an SOG film 122 made of $SiO_2$ is deposited, plural connection holes 124 from which the semiconductor regions and a part of wiring 199 are exposed are formed through the interlayer insulating film 118 and the SOG film 122 by the reduction projection lithography equipment using the KrF excimer laser, photolithography using the photomask produced in the various embodiments of the invention and normal etching technique.

Next, as shown in (d) of FIG. 23, after a metallic film made of aluminum (Al) or an Al alloy is deposited by sputtering, first layer wiring 126 and 127 are formed by patterning the metallic film by the reduction projection lithography equipment using the KrF excimer laser, photolithography using the photomask produced in the various embodiments of the invention and normal etching technique.

Afterward, second layer wiring and third layer wiring (not shown) are formed on the first layer wiring by the similar method to the formation of the first layer wiring and a large-scale logic type semiconductor integrated circuit (LSI) is manufactured.

When a circuit system of custom LSI is designed, mask debugging is often performed particularly about the first layer wiring. To reduce TAT of such LSI, as the timing and the speed of supplying a mask corresponding to the first layer wiring are extremely important and the number of required masks is many, it is extremely effective to apply the invention to this process. The minimum pattern dimension of the second layer wiring is 0.35 $\mu$m and is thick enough, compared with the wavelength of 0.248 $\mu$m of exposure light, however, the photomask according to the invention is also applied. The cost can be reduced, compared with a normal mask made of Cr and TAT can be reduced.

As understood from the above description, the invention can be also applied to a semiconductor integrated circuit provided with a memory element such as a dynamic random access memory (DRAM), a static random access memory (SRAM) or a flash memory (EEPROM), a semiconductor integrated circuit provided with a logical circuit such as a microprocessor or a hybrid semiconductor integrated circuit wherein the memory circuit and the logical circuit are provided on the same semiconductor substrate. Particularly, for logic LSI provided with a logical circuit or system LSI wherein memory LSI and logic LSI are provided, as a period from the design of a pattern to the manufacture is reduced according to the needs of a user and it is important to supply to the user promptly, the invention for reducing mask production time is particularly effective.

The technical concept of the invention is not limited to the application to a method of manufacturing a semiconductor integrated circuit and for example, can be also applied to another electronic circuit such as a liquid crystal substrate, a superconductive device, a magnetic head and a micro machine.

Twelfth Embodiment

FIG. 24 is a plan showing one mask used in a twelfth embodiment. A reference number 2101 in FIG. 24 denotes metallic light shielding material, 2102 denotes resist light shielding material and 2103 denotes an alignment mark for lithography equipment. For lithography equipment, a scanner is used and in the fourth embodiment, the phase shift mask is produced. The same patterns to be printed are vertically arranged in a scanned direction of lithography equipment as shown as 2104 and 2105. However, the phases of the patterns are inverse. That is, a phase $\pi$, a phase 0 and the phase 0 are respectively arranged for body patterns 2106, 2107 and 2108, however, the phase 0, the phase $\pi$ and the phase $\pi$ are respectively arranged for the corresponding patterns 2106', 2107' and 2108'. The phase $\pi$ is arranged for an assist pattern 2109, however, the phase 0 is arranged for a pattern 2109'. This mask is installed in the scanner and is scanned and exposed. 2104 at that time is regarded as one chip and 2105 is carried so that it is overlapped with 2104, that is, is exposed multiply. "0/$\pi$ difference" between the dimensions of printed patterns is never made by exposing multiply. The method fulfils the effect particularly in a scanner. This reason is that in a scanner, exposure is performed using a part of a lens in the shape of a slit. In the meantime, in a method of exposing using the whole lens in a stepper, as the aberration of lenses is different between 2104 and 2105 and an image in which the aberration are added is printed, dimension accuracy is deteriorated.

The brief description of effect acquired by representatives of the inventions disclosed in the application is as follows. (1) As the number of the manufacturing processes of the phase shift mask is reduced and processes in which a foreign matter often occurs such as the formation of a Cr film by sputtering and the etching of the Cr film are never used when a mask pattern for forming a minute pattern is produced, the mask manufacturing yield is also enhanced. The reduction of the number of manufacturing processes is also greatly effective in TAT for producing a mask. (2) The control accuracy of a phase angle is enhanced. Particularly, in the method of forming the shifter on the blansk in the first to third embodiments, this effect is large. As there is hardly micro loading effect by etching, a phase angle can be unified in various dimensions and the dimension controllability of a printed pattern is high. (3) As a part where a phase angle varies, that is, the edge of the shifter is covered with a light shielding film (for example, a photoresist) made of dielectric material, high resistance material or organic material, reflection from the side wall of the light shielding film and guide wave effect can be reduced in printing, a problem of the shortage of mask pattern strength by miniaturization does not occur and the miniaturization of a printing pattern is facilitated. Superficial reflection is also small and the dimension accuracy of a printed pattern is high. 0/$\pi$ difference between the dimensions of Levenson type phase shift masks is small. (4) As a metal light shielding region is provided in the periphery of the mask substrate of the photomask and the mark pattern for detecting the information of the photomask is formed by removing a part, the information detection capacity of the photomask can be enhanced. No foreign matter is caused when the mask is installed in lithography equipment. (5) The mask can be easily identified by providing a mask identification mark on the metal plate. (6) By the effect described in the above (1) to (5), the performance, the reliability, TAT for development and the manufacturing yield of the electronic circuit such as a semiconductor integrated circuit manufactured using the photomask according to the invention can be enhanced.

What is claimed is:

1. The manufacturing method of an electron device, wherein:

a photosensitive film provided to the surface of a workpiece to be an electron device is exposed via a mask wherein a phase shifter is partially formed on the flat surface of a transparent plate and a light shielding film made of non-metal with an OD value of 3 or more is partially provided with the film covering the end of the phase shifter and is developed.

2. The manufacturing method of an electron device according to claim 1, wherein:

the section in the direction of the thickness of the end of the phase shifter is tapered.

3. The manufacturing method of an electron device according to claim 1, wherein:

the light shielding film is made of dielectric material, high resistance material or organic material.

4. The manufacturing method of an electron device according to claim 1, wherein:

the light shielding film is a photoresist mainly made of novolac resin, phenol resin or polyaniline resin.

5. The manufacturing method of an electron device, wherein:

a photosensitive film provided to the surface of a workpiece to be an electron device is exposed via a mask wherein a light shielding film made of non-metal with an OD value of 3 or more is partially provided on the surface of a transparent plate on which a concavity or a convexity is partially formed with the film covering the end of the concavity or the convexity and is developed.

6. The manufacturing method of an electron device according to claim 5, wherein:

the light shielding film is made of dielectric material, high resistance material or organic material.

7. The manufacturing method of an electron device according to claim 5, wherein:

the light shielding film is a photoresist mainly made of novolac resin, phenol resin or polyaniline resin.

8. A pattern forming method, wherein:

a light shielding film with an OD value of 3 or more pattern is projection-exposed on a photosensitive film provided on the surface of a workpiece using a mask wherein phase shift means that inverts the phase of exposure light in printing is partially formed on the surface of a transparent plate and the light shielding film pattern made of non-metal is partially provided with the pattern covering the end of the phase shift means and the exposed photosensitive film is developed.

9. A pattern forming method according to claim 8, wherein:

the transparent plate is composed of a transparent substrate and a first transparent film provided on the surface;

the phase shift means is composed of a second transparent film formed on the surface of the first transparent film; and the refractive index of the exposure light in the first transparent film is larger than that of the transparent substrate and is smaller than that of the second transparent film.

10. A pattern forming method according to claim 8, wherein:

the phase shift means has a concavity or a convexity formed on the surface of the transparent plate.

11. A pattern forming method according to claim 8, wherein:

the light shielding film is made of dielectric material, high resistance material or organic material.

12. A pattern forming method according to claim 8, wherein the light shielding film is a photoresist mainly made of novolac resin, phenol resin or polyaniline resin.

13. A pattern forming method, wherein:

one photosensitive film provided on the surface of a workpiece is projection-exposed multiply using a first mask wherein phase shift means that inverts the phase of exposure light in printing is partially formed on the surface of a transparent plate and a light shielding layout pattern made of non-metal with an OD value of 3 or more is provided with the pattern covering the end of the phase shift means and a second mask provided with the same second light shielding layout pattern as the light shielding layout pattern of the first mask and the second phase shift means the phase of which is inverse to that of the phase shift means of the first mask and the exposed photosensitive film is developed.

14. The manufacturing method of an electron device, wherein:

when a light shielding pattern with an OD value of 3 or more is printed on the surface of a workpiece to be an electron device using a mask on the surface of which a light shielding pattern made of a photoresist is arranged by projection lithography equipment, the surface of the photoresist is printed without touching the surface to the stage of the projection lithography equipment and its carriage means.

* * * * *